(12) United States Patent
Lee et al.

(10) Patent No.: US 9,466,593 B2
(45) Date of Patent: Oct. 11, 2016

(54) STACK SEMICONDUCTOR PACKAGE

(71) Applicants: Dae-Ho Lee, Hwaseong-si (KR);
Hyo-Soon Kang, Seoul (KR);
Seok-Hong Kwon, Hwaseong-si (KR);
Tae-Young Yoon, Hwaseong-si (KR);
Hee-Jin Lee, Seongnam-si (KR)

(72) Inventors: Dae-Ho Lee, Hwaseong-si (KR);
Hyo-Soon Kang, Seoul (KR);
Seok-Hong Kwon, Hwaseong-si (KR);
Tae-Young Yoon, Hwaseong-si (KR);
Hee-Jin Lee, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/983,510

(22) Filed: Dec. 29, 2015

(65) Prior Publication Data

US 2016/0190109 A1 Jun. 30, 2016

(30) Foreign Application Priority Data

Dec. 31, 2014 (KR) .................. 10-2014-0194727

(51) Int. Cl.
*H01L 23/02* (2006.01)
*H01L 25/16* (2006.01)
*H01L 25/10* (2006.01)
*H01L 25/065* (2006.01)

(52) U.S. Cl.
CPC ......... *H01L 25/162* (2013.01); *H01L 25/0655* (2013.01); *H01L 25/105* (2013.01)

(58) Field of Classification Search
CPC ............... H01L 25/0657; H01L 2224/48247; H01L 2224/73265; H01L 2224/48145; H01L 24/48; H01L 24/49; H01L 25/0652
USPC ................... 257/686, 777, 723, 724
See application file for complete search history.

(56) References Cited

U.S. PATENT DOCUMENTS

| 5,701,031 | A   | * | 12/1997 | Oguchi | ............... G11C 5/00 257/686 |
|---|---|---|---|---|---|
| 8,698,301 | B2 |   | 4/2014 | Kwon et al. | |
| 8,766,425 | B2 |   | 7/2014 | Ishikawa et al. | |
| 8,791,559 | B2 |   | 7/2014 | Kim et al. | |
| 2010/0283140 | A1 | * | 11/2010 | Kim | ............... H01L 23/3128 257/686 |
| 2010/0314740 | A1 | * | 12/2010 | Choi | ............... H01L 23/3121 257/686 |
| 2011/0031600 | A1 | * | 2/2011 | Kim | ............... H01L 23/13 257/686 |
| 2012/0007227 | A1 | * | 1/2012 | Choi | ............... H01L 23/3128 257/686 |
| 2013/0009308 | A1 |   | 1/2013 | Kwon | |

(Continued)

FOREIGN PATENT DOCUMENTS

KR 20140056875 A 5/2014

*Primary Examiner* — S. V. Clark
(74) *Attorney, Agent, or Firm* — Renaissance IP Law Group LLP

(57) ABSTRACT

A stack semiconductor package includes a first semiconductor package having a first package substrate and a first semiconductor chip mounted on the first package substrate. The first semiconductor chip includes first chip pads arranged along a side portion thereof. The stack semiconductor package includes a second semiconductor package disposed on the first semiconductor package, and includes a second package substrate. A first sub-chip and a second sub-chip is mounted on the second semiconductor package and arranged side by side extending along a direction of a first side portion of the second package substrate. Each of the first and second sub-chips includes second chip pads arranged along a side portion thereof. Connection wiring paths between interface portions and connection pads may be reduced and simplified, thereby preventing connection wires from being tangled. Moreover, connection wiring paths between a logic chip and a memory chip may be minimized, thereby providing high speed performance.

20 Claims, 23 Drawing Sheets

(56) References Cited

U.S. PATENT DOCUMENTS

| | | |
|---|---|---|
| 2013/0113108 A1 | 5/2013 | Wang et al. |
| 2014/0001653 A1 | 1/2014 | Kwon et al. |
| 2014/0124921 A1 | 5/2014 | Lee et al. |
| 2014/0138851 A1 | 5/2014 | Kim et al. |
| 2014/0145331 A1 | 5/2014 | Hwang et al. |
| 2014/0217586 A1 | 8/2014 | Kim et al. |
| 2014/0246788 A1 | 9/2014 | Kim et al. |
| 2014/0264857 A1 | 9/2014 | Wu |

* cited by examiner

STACK SEMICONDUCTOR PACKAGE

PRIORITY STATEMENT

This application claims priority under 35 U.S.C. §119 to Korean Patent Application No. 10-2014-0194727, filed on Dec. 31, 2014 in the Korean Intellectual Property Office (KIPO), the contents of which are herein incorporated by reference in their entirety.

BACKGROUND

1. Field

Example embodiments relate to a stack semiconductor package. More particularly, example embodiments relate to a Package-On-Package (POP) type stack semiconductor package.

2. Description of the Related Art

Various semiconductor packaging techniques have been proposed in response to a demand for high performance, high speed and compact electronic products. In particular, in a Package-On-Package (POP) device, which can include multiple packages that are stacked one atop another, a plurality of semiconductor chips may be provided in each package. Such configurations can improve the compactness and performance of electronic products.

In a POP device, a signal interconnecting routing may be required for an interface between a logic chip and a memory chip within a limited area. As the wiring layout between the semiconductor chips in the package becomes complex, routability and signal connection performance of the device may deteriorate. Embodiments of the inventive concept address these and other limitations of the prior art.

SUMMARY

Example embodiments provide a stack semiconductor package capable of improving routability and interface performances.

According to example embodiments, a stack semiconductor package includes a first semiconductor package including a first package substrate and a first semiconductor chip mounted on the first package substrate, the first semiconductor chip having first chip pads arranged along a side portion thereof. The stack semiconductor package may further include a second semiconductor package disposed on the first semiconductor package and including a second package substrate, a first sub-chip and a second sub-chip mounted on the second semiconductor package, the first sub-chip and the second sub-chip being arranged side by side extending along a direction of a first side portion of the second package substrate, each of the first and second sub-chips having second chip pads arranged along a side portion thereof.

The second package substrate may include second connection pads electrically connected to the second chip pads and arranged along the first side portion of the second package substrate. The first package substrate may include first connection pads electrically connected to the first chip pads and arranged along a first side portion of the first package substrate corresponding to the second connection pads.

Embodiments of the inventive concept include a stack semiconductor package, comprising a first semiconductor package. The first semiconductor package may include a first package substrate, and a first semiconductor chip mounted on the first package substrate, the first semiconductor chip having first chip pads arranged along a side portion thereof.

In some embodiments, the stack semiconductor package may include a second semiconductor package disposed on the first semiconductor package. The second semiconductor package may include a second package substrate, a first sub-chip, a second sub-chip, a third sub-chip, and a fourth sub-chip mounted on the second package substrate, the first sub-chip and the second sub-chip being arranged side by side extending along a direction of a first side portion of the second package substrate, the third sub-chip and the fourth sub-chip being arranged side by side extending along a direction of a second side portion of the second package substrate, each of the first, second, third, and fourth sub-chips having second chip pads arranged along a side portion thereof.

The second package substrate may include second connection pads electrically connected to the second chip pads and arranged along the first side portion and the second side portion of the second package substrate. The first package substrate may include first connection pads electrically connected to the first chip pads and arranged along a first side portion of the first package substrate corresponding to the second connection pads, and along a second side portion of the first package substrate corresponding to the second connection pads.

Accordingly, connection wiring paths between the interface portion and the first connection pads may be reduced and simplified to thereby prevent connection wires from being tangled. Further, connection wiring paths between the logic chip and the memory chip may be minimized to thereby provide high speed performance.

BRIEF DESCRIPTION OF THE DRAWINGS

Example embodiments will be more clearly understood from the following detailed description taken in conjunction with the accompanying drawings.

FIG. 1 is a perspective view illustrating a stack semiconductor package in accordance with example embodiments.

FIGS. 2 and 3 are exploded perspective views illustrating the stack semiconductor package of FIG. 1.

FIG. 4 is a cross-sectional view illustrating the stack semiconductor package of FIG. 1.

FIG. 5 is a plan view illustrating a first package substrate of a first semiconductor package of FIG. 1.

FIG. 6 is a bottom view illustrating a first semiconductor chip mounted on the first package substrate of FIG. 5.

FIG. 7 is a plan view illustrating a second package substrate of a second semiconductor package of FIG. 1.

FIG. 8 is a bottom view illustrating the second package substrate of FIG. 7.

FIG. 9 is a plan view illustrating a second semiconductor chip mounted on the second package substrate of FIG. 7.

FIG. 10 is a perspective view illustrating a stack semiconductor package in accordance with example embodiments.

FIGS. 11 and 12 are exploded perspective views illustrating the stack semiconductor package of FIG. 10.

FIG. 13 is a plan view illustrating a first package substrate of a first semiconductor package of FIG. 10.

FIG. 14 is a bottom view illustrating a first semiconductor chip mounted on the first package substrate of FIG. 13.

FIG. 15 is a plan view illustrating a second package substrate of a second semiconductor package of FIG. 10.

FIG. 16 is a bottom view illustrating the second package substrate of FIG. 15.

FIG. 17 is a perspective view illustrating a stack semiconductor package in accordance with example embodiments.

FIGS. 18 and 19 are exploded perspective views illustrating the stack semiconductor package of FIG. 17.

FIG. 20 is a cross-sectional view illustrating the stack semiconductor package of FIG. 17.

FIG. 21 is a plan view illustrating a first package substrate of a first semiconductor package of FIG. 17.

FIG. 22 is a bottom view illustrating a first semiconductor chip mounted on the first package substrate of FIG. 21.

FIG. 23 is a plan view illustrating a second package substrate of a second semiconductor package of FIG. 17.

FIG. 24 is a bottom view illustrating the second package substrate of FIG. 23.

FIG. 25 is a block diagram illustrating a memory card including a stack semiconductor package in accordance with example embodiments.

FIG. 26 is a block diagram illustrating an electronic system including a stack semiconductor package in accordance with example embodiments.

DETAILED DESCRIPTION

Figure 1:
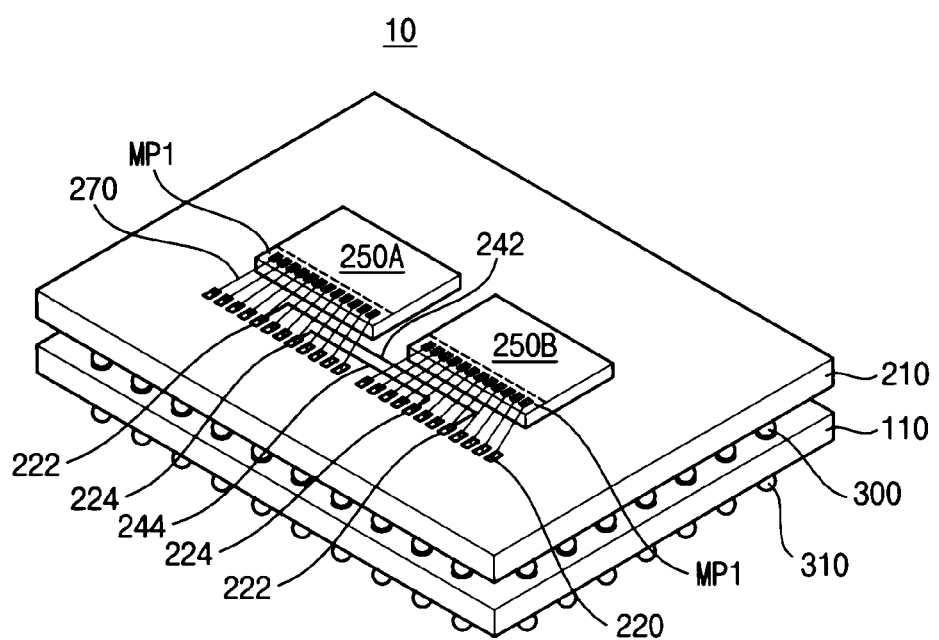
FIGS. 1 to 26 represent non-limiting, example embodiments as described herein.

Various example embodiments will be described more fully hereinafter with reference to the accompanying drawings, in which example embodiments are shown. Example embodiments may, however, be embodied in many different forms and should not be construed as limited to example embodiments set forth herein. Rather, these example embodiments are provided so that this disclosure will be thorough and complete, and will fully convey the scope of example embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular example embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized example embodiments (and intermediate structures). As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments will be explained in detail with reference to the accompanying drawings.

Figure 2:
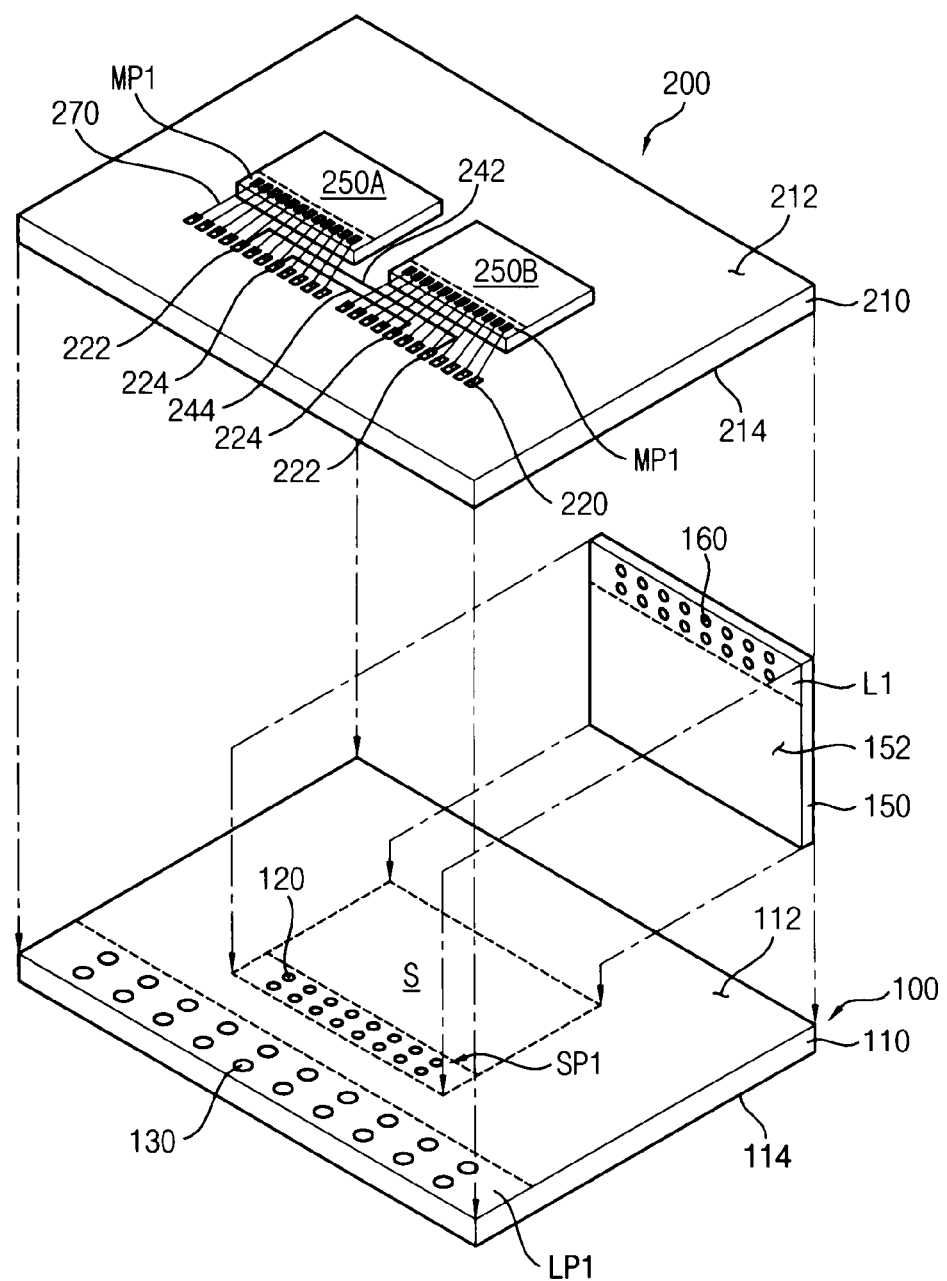
Figure 3:
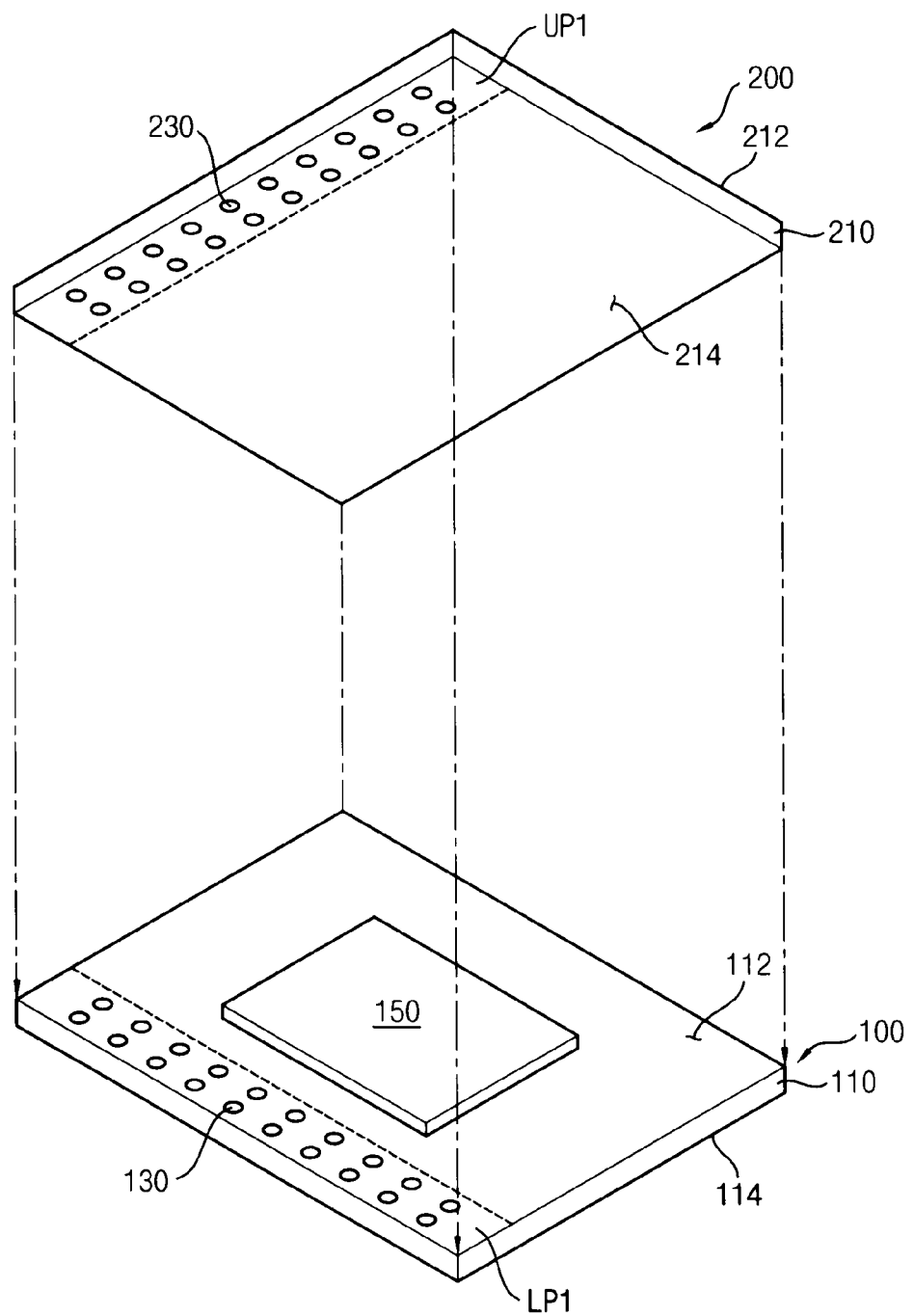
Figure 4:
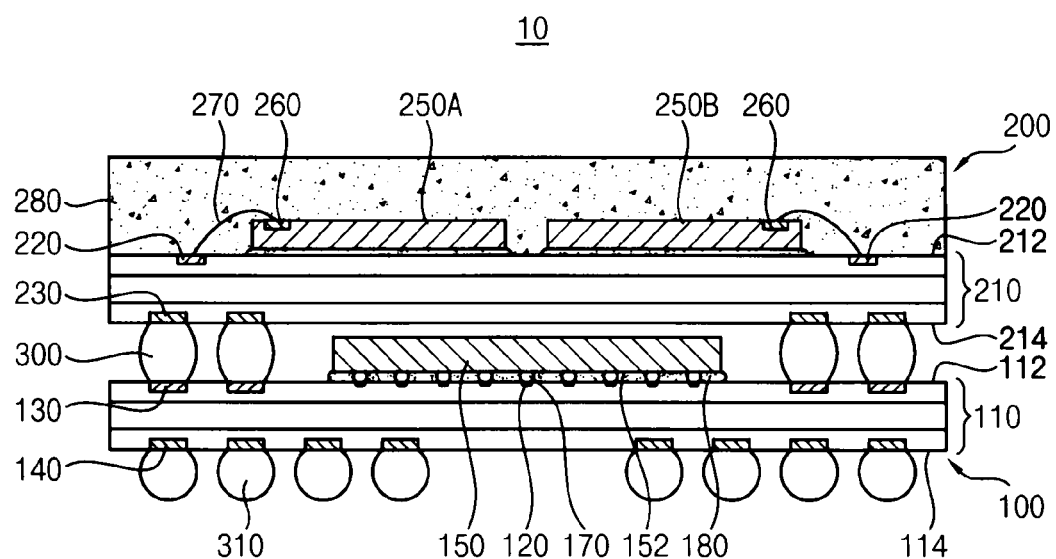
Figure 5:
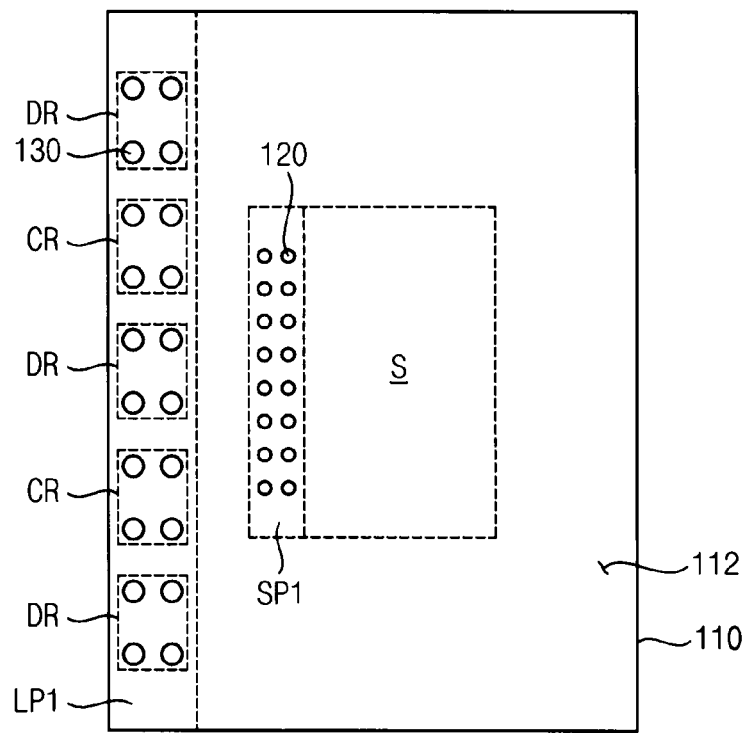
Figure 6:
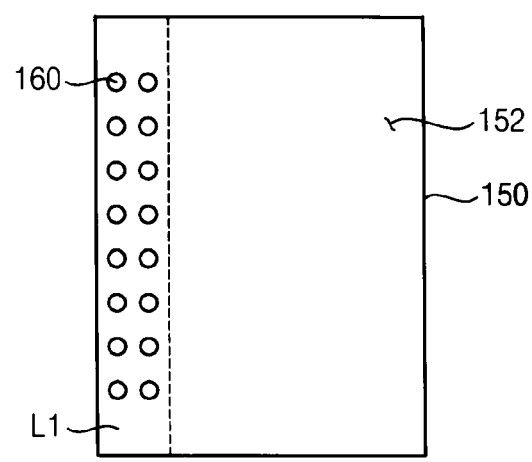
Figure 7:
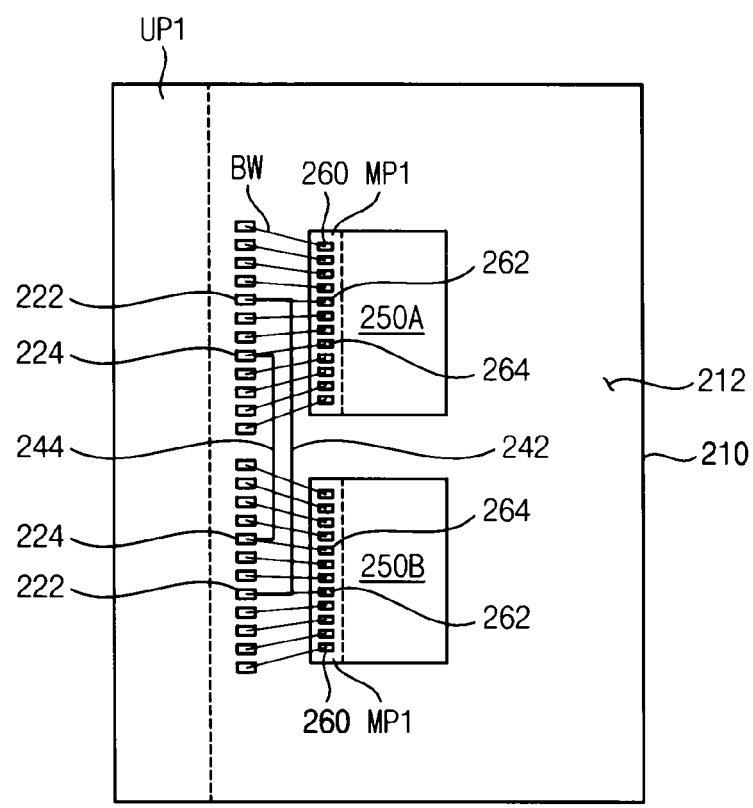
Figure 8:
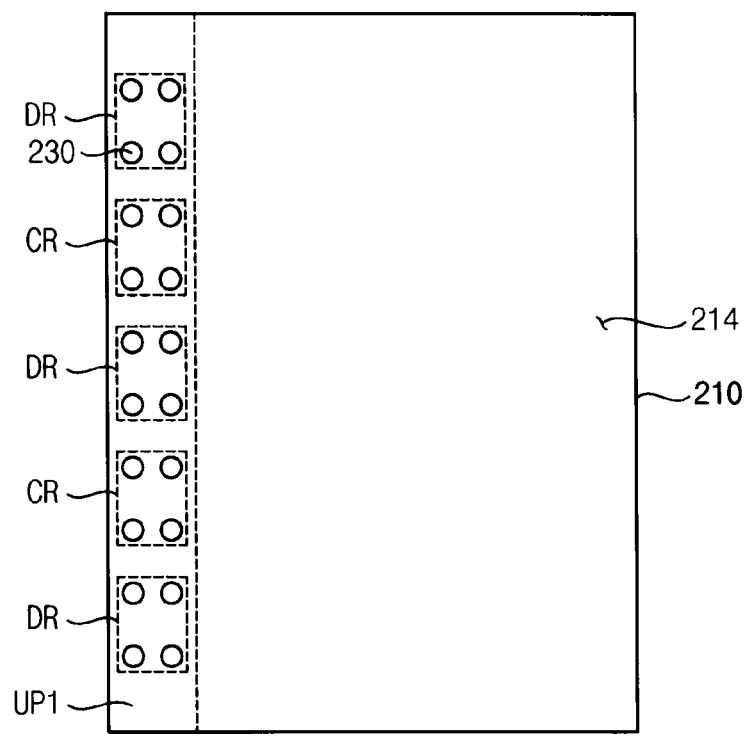
Figure 9:
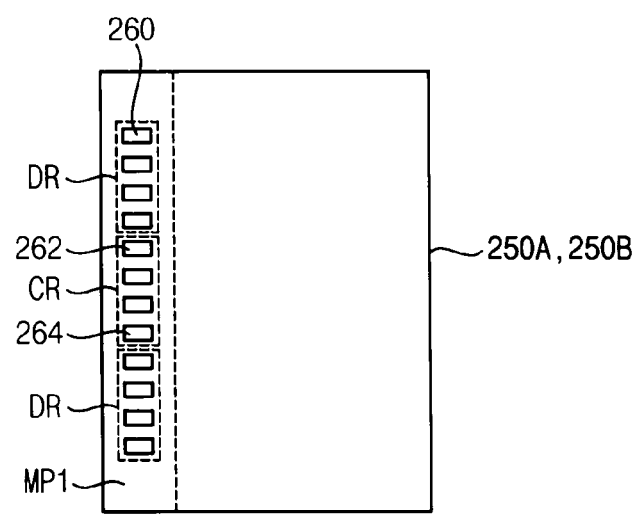

FIG. 1 is a perspective view illustrating a stack semiconductor package in accordance with example embodiments. FIGS. 2 and 3 are exploded perspective views illustrating the stack semiconductor package of FIG. 1. FIG. 4 is a cross-sectional view illustrating the stack semiconductor package of FIG. 1. FIG. 5 is a plan view illustrating a first package substrate of a first semiconductor package of FIG. 1. FIG. 6 is a bottom view illustrating a first semiconductor chip mounted on the first package substrate of FIG. 5. FIG. 7 is a plan view illustrating a second package substrate of a second semiconductor package of FIG. 1. FIG. 8 is a bottom view illustrating the second package substrate of FIG. 7. FIG. 9 is a plan view illustrating a second semiconductor chip mounted on the second package substrate of FIG. 7.

Referring to FIGS. 1 to 9, a stack semiconductor package 10 may include a first semiconductor package 100 and a second semiconductor package 200 stacked on the first semiconductor package 100. The stack semiconductor package 10 may be a Package-On-Package (POP) type semiconductor package having a lower semiconductor package 100 and an upper semiconductor package 200.

In example embodiments, the first semiconductor package 100 may include a first package substrate 110 and a first semiconductor chip 150 mounted on the first package substrate 110. The first semiconductor chip 150 may be stacked on an upper surface 112 of the first package substrate 110. The upper surface 112 of the first package substrate 110 may have a chip mounting region S. The first semiconductor chip 150 may be arranged in the chip mounting region S.

The first semiconductor chip 150 may be mounted on the first package substrate 110 such that an active surface 152 faces the upper surface 112 of the first package substrate 110. For example, the first semiconductor chip 150 may be mounted on the first package substrate 110 by a flip-chip bonding method. The first semiconductor chip 150 may be electrically connected to the first package substrate 110 via solder bumps 170, as shown in FIG. 4. An underfill member 180 may be underfilled between the active surface 152 of the first semiconductor chip 150 and the upper surface 112 of the first package substrate 110. Alternatively, the first semiconductor chip 150 may be electrically connected to the first package substrate 110 using various signal transmission members such as bonding wires, solder balls, or the like.

The first semiconductor chip 150 may have a plurality of first chip pads 160 on the active surface 152 thereof. The first chip pads 160 may be arranged along a first side portion L1 on the active surface 152 of the first semiconductor chip 150. It will be understood that additional chip pads (not shown) may be arranged along a second side portion opposite to the first side portion L1, or third and fourth side portions adjacent to the first side portion L1 of the first semiconductor chip 150.

A plurality of bump pads 120 and a plurality of first connection pads 130 may be formed on the upper surface 112 of the first package substrate 110. The bump pads 120 may be arranged along a first side portion SP1 of the chip mounting region S corresponding to the first chip pads 160. Accordingly, the solder bumps 170 may be arranged between the first chip pad 160 and the bump pad 120 to electrically connect the first semiconductor chip 150 to the first package substrate 110.

The first connection pads 130 may be arranged adjacent to the bump pads 120 along a first side portion LP1 on the upper surface 112 of the first package substrate 110. The first connection pads 130 may be electrically connected to the bump pads 120 through substrate conductors, such as wires, in the first package substrate 110. Accordingly, the first connection pads 130 may be electrically connected to the first chip pads 160 of the first semiconductor chip 150 through the substrate wires and the solder bumps 170.

In example embodiments, the second semiconductor package 200 may include a second package substrate 210. The second semiconductor package 200 may include a first sub-chip 250A and a second sub-chip 250B mounted on the second package substrate 210. The first and second sub-chips 250A and 250B may be disposed on an upper surface 212 of the second package substrate 210 respectively. The first and second sub-chips 250A and 250B may be arranged side by side extending along a direction of a first side portion UP1 of the second package substrate 210.

The first and second sub-chips 250A and 250B may be mounted on the upper surface 212 of the second package substrate 210 via an adhesive layer. The first sub-chip 250A may have a plurality of second chip pads 260 on an active surface thereof. The second chip pads 260 may be arranged along a first side portion MP1 on the active surface of the first sub-chip 250A. Similar to the first sub-chip 250A, the second chip pads 260 of the second sub-chip 250B may be arranged along a first side portion MP1 on an active surface of the second sub-chip 250B. All second chip pads on the first and second sub-chips 250A and 250B may be integrated and formed on one end portion and/or in one direction. Alternatively, the second chip pads may be arranged along both side portions, or along four side portions, respectively. It will be understood that additional chip pads (not shown) may be arranged along a second side portion opposite to the first side portion MP1, or third and fourth side portions adjacent to the first side portion MP1 of the first and second sub-chips 250A and 250B.

A plurality of substrate pads 220 may be formed on the upper surface 212 of the second package substrate 210. The substrate pads 220 may be arranged adjacent to the second chip pads 260 along the first side portion UP1 on the upper surface 212 of the second package substrate 210. A conductor (e.g., wire) 270 may connect a substrate pad from among the substrate pads 220 to a corresponding one of the second chip pads 260. It will be understood that a plurality of conductors (e.g., wires) 270 may connect each of the substrate pads 220 to a corresponding one of the second chip pads 260. Accordingly, the conductors (e.g., wires) 270 may serve as signal transmission members for electrically connecting the second chip pads 260 and the substrate pads 220. Alternatively, the first and second sub-chips 250A and 250B may be electrically connected to the second package substrate 210 using various signal transmission members such as solder bumps or solder balls.

A plurality of second connection pads 230 may be formed on a lower surface 214 of the second package substrate 210. The second connection pads 230 may be arranged adjacent to the first connection pads 130 along the first side portion UP1 on the lower surface 214 of the second package substrate 210. The second connection pads 230 may be electrically connected to the substrate pads 220 through substrate conductors (e.g., wires) in the second package substrate 210. Accordingly, the second connection pads 230 may be electrically connected to the second chip pads 260 of the first and second sub-chips 250A and 250B through the substrate conductors (e.g., wires) and the conductors (e.g., wires) 270.

In example embodiments, the stack semiconductor package 10 may further include a plurality of conductive connection members, which may be arranged between the first semiconductor package 100 and the second semiconductor package 200. The conductive connection members may electrically connect the first and second semiconductor packages 100 and 200 to each other. For example, the conductive connection member may include a first solder ball 300.

The first solder ball 300 may be arranged between the first connection pad 130 and the second connection pad 230 to electrically connect the first package substrate 110 and the second package substrate 210. Accordingly, a chip pad from among the first chip pads 160 of the first semiconductor chip 150 may be electrically connected to a chip pad from among the second chip pads 260 of the first and second sub-chips 250A and 250B through the first solder ball 300. It will be understood that a plurality of solder balls 300 can connect each of the first connection pads 130 to a corresponding one of the second connection pads 230. Accordingly, the first chip pads 160 of the first semiconductor chip 150 may be electrically connected to the second chip pads 260 of the first and second sub-chips 250A and 250B through the plurality of first solder balls 300.

In example embodiments, the stack semiconductor package 10 may be a System-In-Package (SIP) type semiconductor package where semiconductor chips that can perform various functions (for example, a memory chip and a logic chip) are integrated into one package. In this case, the first semiconductor chip 150 may be a logic chip. The first semiconductor chip 150 may be a System-On-Chip (SOC) type semiconductor chip performing various functions. The first sub-chip 250A and the second sub-chip 250B may be electrically connected to each other to constitute one memory chip. That is, the first and second sub-chips 250A and 250B may be bisection chips, which are bisected from one memory chip, for example, a low power double data rate (e.g., LPDDR4) memory chip.

The first semiconductor chip 150 may be electrically connected to the memory chip, which may include the first and second sub-chips 250A and 250B of the second semiconductor package 200. As illustrated in FIG. 6, the first chip pads 160 arranged along the first side portion L1 of the first semiconductor chip 150 may constitute one control channel for controlling the memory chip of the second semiconductor package 200. The first chip pads 160 may include data logic pads. Moreover, the first chip pads 160 may include command and/or address logic pads. Signals related to data may be input and/or output through the data logic pads. Signals related to a command and/or address may be input and/or output through the command and/or address logic pads.

Alternatively, when the second semiconductor package 200 includes two, three, four or more memory chips, the first semiconductor chip 150 may include chip pads arranged along a second side portion opposite to the first side portion L1, or third and fourth side portions adjacent to the first side portion L1, to provide two, three, four or more control channels.

As illustrated in FIGS. 7 and 9, the second chip pads 260 may include data memory pads (e.g., DQ pads). Alternatively or in addition, the second chip pads 260 may include command and/or address memory pads (e.g., CA pads). Signals related to data may be input and/or output through the data memory pads. Signals related to a command and/or address may be input and/or output through the command and/or address memory pads. The data memory pads may be arranged in a first region (DR). The command and/or address memory pads may be arranged in a second region (CR) adjacent to the first region (DR). The second chip pads 260 may include a first connection memory pad 262 and a second connection memory pad 264. The substrate pads 220 may include a first connection substrate pad 222 and a second connection substrate pad 224. It will be understood that the number of the first and second connection substrate pads may not be limited thereto, but rather, the number of connection substrate pads can be any suitable number.

The first connection memory pad 262 of the first sub-chip 250A may be electrically connected to the first connection substrate pad 222 on the upper surface 212 of the second package substrate 210, for example, by the conductor (e.g., wire) 270. The second connection memory pad 264 of the first sub-chip 250A may be electrically connected to the second connection substrate pad 224 on the upper surface 212 of the second package substrate 210 by another conductor (e.g., wire) 270.

The first connection memory pad 262 of the second sub-chip 250B may be electrically connected to the first connection substrate pad 222 on the upper surface 212 of the second package substrate 210 by the conductor (e.g., wire) 270. The second connection memory pad 264 of the second sub-chip 250B may be electrically connected to the second connection substrate pad 224 on the upper surface 212 of the second package substrate 210 by the conductor (e.g., wire) 270.

The first connection substrate pads 222 on the upper surface 212 of the second package substrate 210 may be electrically connected to each other by a first connection conductor (e.g., wire) 242 in the second package substrate 210. The second connection substrate pads 224 on the upper surface 212 of the second package substrate 210 may be electrically connected to each other by a second connection conductor (e.g., wire) 244 in the second package substrate 210.

Accordingly, the first connection memory pad 262 of the first sub-chip 250A may be electrically connected to the first connection memory pad 262 of the second sub-chip 250B by the first connection conductor (e.g., wire) 242. The second connection memory pad 264 of the first sub-chip 250A may be electrically connected to the second connection memory pad 264 of the second sub-chip 250B by the second connection conductor (e.g., wire) 244. For example, the first and second connection memory pads 262 and 264 may include a ZQ pad, a reset pad, etc. The ZQ pad such as one of the CA pins may be used for impendence calibration between the first and second sub-chips. The reset pad may be used for initializing a signal.

Thus, the first sub-chip 250A and the second sub-chip 250B may be electrically connected to each other by the connection conductors (e.g., wires) 242 and 244 in the second package substrate 210 to constitute one memory chip.

As illustrated in FIG. 5, the bump pads 120 of the first package substrate 110 may constitute a first interface portion. The first interface portion may be a physical terminal (PHY) which is disposed along the first side portion SP1 of the chip mounting region S. The first connection pads 130 may be arranged adjacent to the bump pads 120 along the first side portion LP1 of the first package substrate 110. The first connection pads 130 may be electrically connected to the first interface portion by the substrate conductors (e.g., wires).

The first connection pads 130 of the first package substrate 110 may include first data connection pads. The first connection pads 130 of the first package substrate 110 may include first command and/or address connection pads. The first data connection pad may be electrically connected to the data logic pad of the first semiconductor chip 150. The first command and/or address connection pad may be electrically connected to the command and/or address logic pad of the first semiconductor chip 150. The first data connection pads may be arranged in a first region (DR). The first command and/or address connection pads may be arranged in a second region (CR) adjacent to the first region (DR). The first region (DR) and the second region (CR) may be arranged repeatedly and alternately along the first side portion LP1.

As illustrated in FIG. 8, the second connection pads 230 of the second package substrate 210 may include second data connection pads. The second connection pads 230 of the second package substrate 210 may include second command and/or address connection pads. The second data connection pads may be electrically connected to the data memory pads of the first and second sub-chips 250A and 250B. The second command and/or address connection pads may be electrically connected to the command and/or address memory pads of the first and second sub-chips 250A and 250B. The second data connection pads may be arranged in a first region (DR). The second command and/or address connection pads may be arranged in a second region (CR) adjacent to the first region (DR). The first region (DR) and the second region (CR) may be arranged repeatedly and alternately along the first side portion UP1.

A molding member 280 may be formed on the upper surface of the second package substrate 210 to cover the first and second sub-chips 250A and 250B. For example, the molding member may be formed using epoxy molding compound (EMC). Second solder balls 310 may be disposed on outer connection pads 140 on a lower surface 114 of the first package substrate 110 respectively. The stack semiconductor package 10 may be mounted on a board substrate (not illustrated) via the second solder balls 310 to provide a semiconductor module.

As mentioned above, the bump pads 120 of the first package substrate 110, which are connected to the logic chip and constitute the first interface portion, may be arranged along the first side portion SP1 of the chip mounting region S. The first connection pads 130 may be arranged adjacent to the bump pads 120 along the first side portion LP1 of the first package substrate 110. Accordingly, connection wiring paths between the first interface portion and the first connection pads 130 may be reduced and simplified to thereby prevent connection conductors (e.g., wires) from being tangled.

Further, the second connection pads 230, which are electrically connected to the first and second sub-chips 250A and 250B, and which may constitute one memory chip, may be arranged along the first side portion UP1 on the lower surface 214 of the second package substrate 210. The second connection pads 230 may correspond to the first connection pads 130. In other words, the number of second connection pads 230 may be the same or similar to the number of first connection pads 130, and may be arranged to face each other. Accordingly, connection wiring paths between the logic chip and the memory chip may be minimized, thereby providing high-speed performance.

Figure 10:
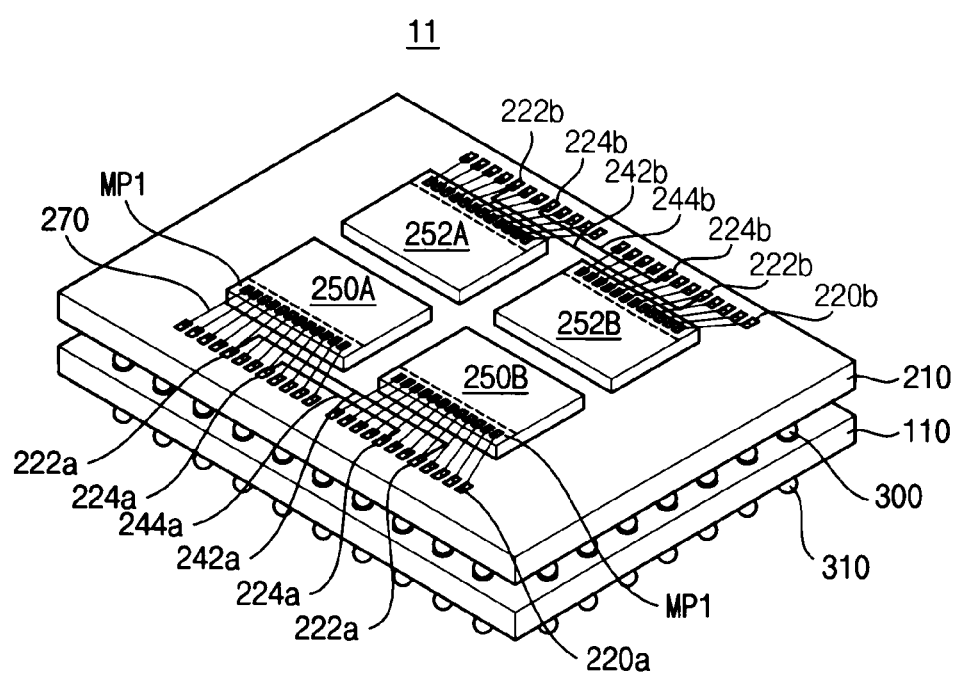
Figure 11:
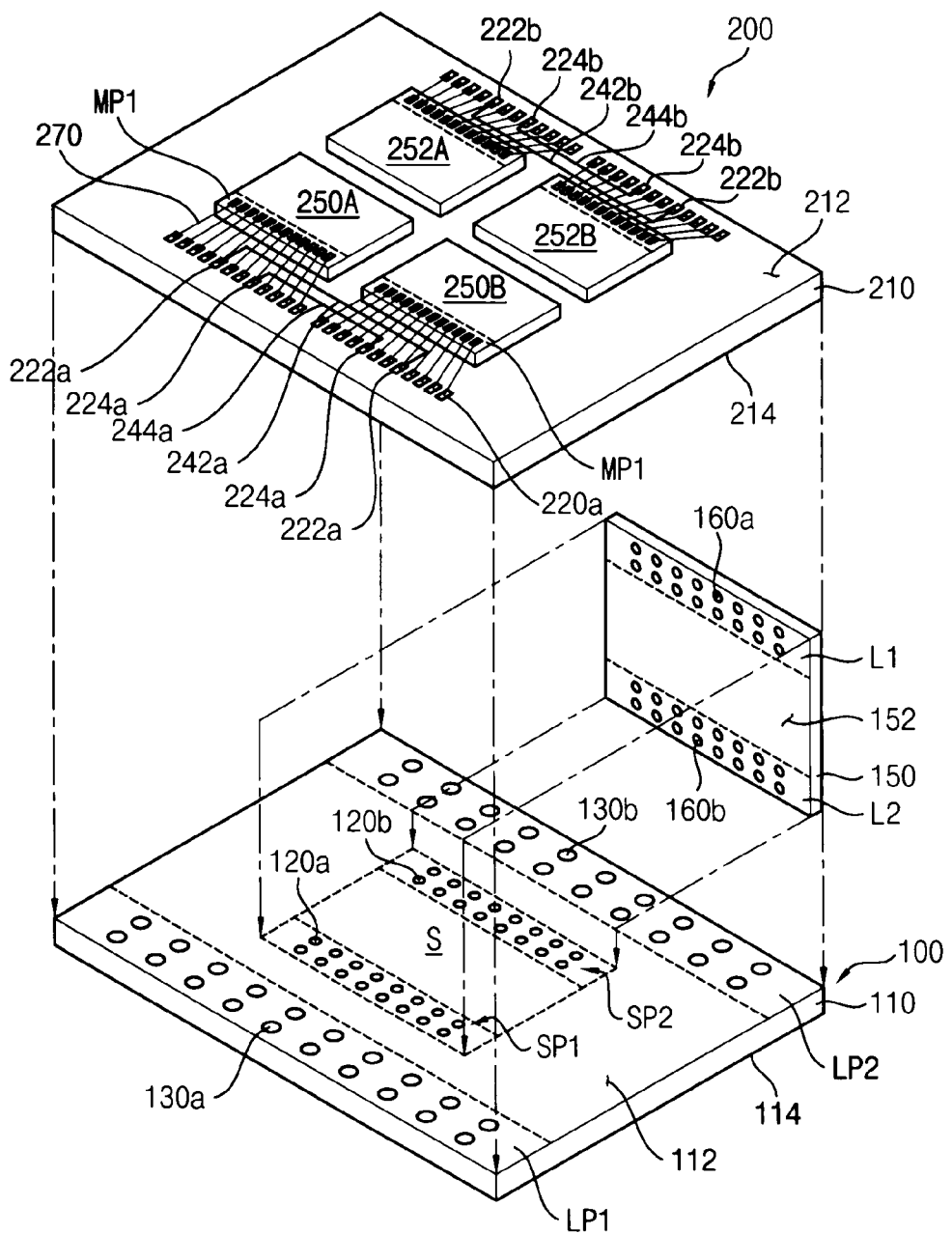
Figure 12:
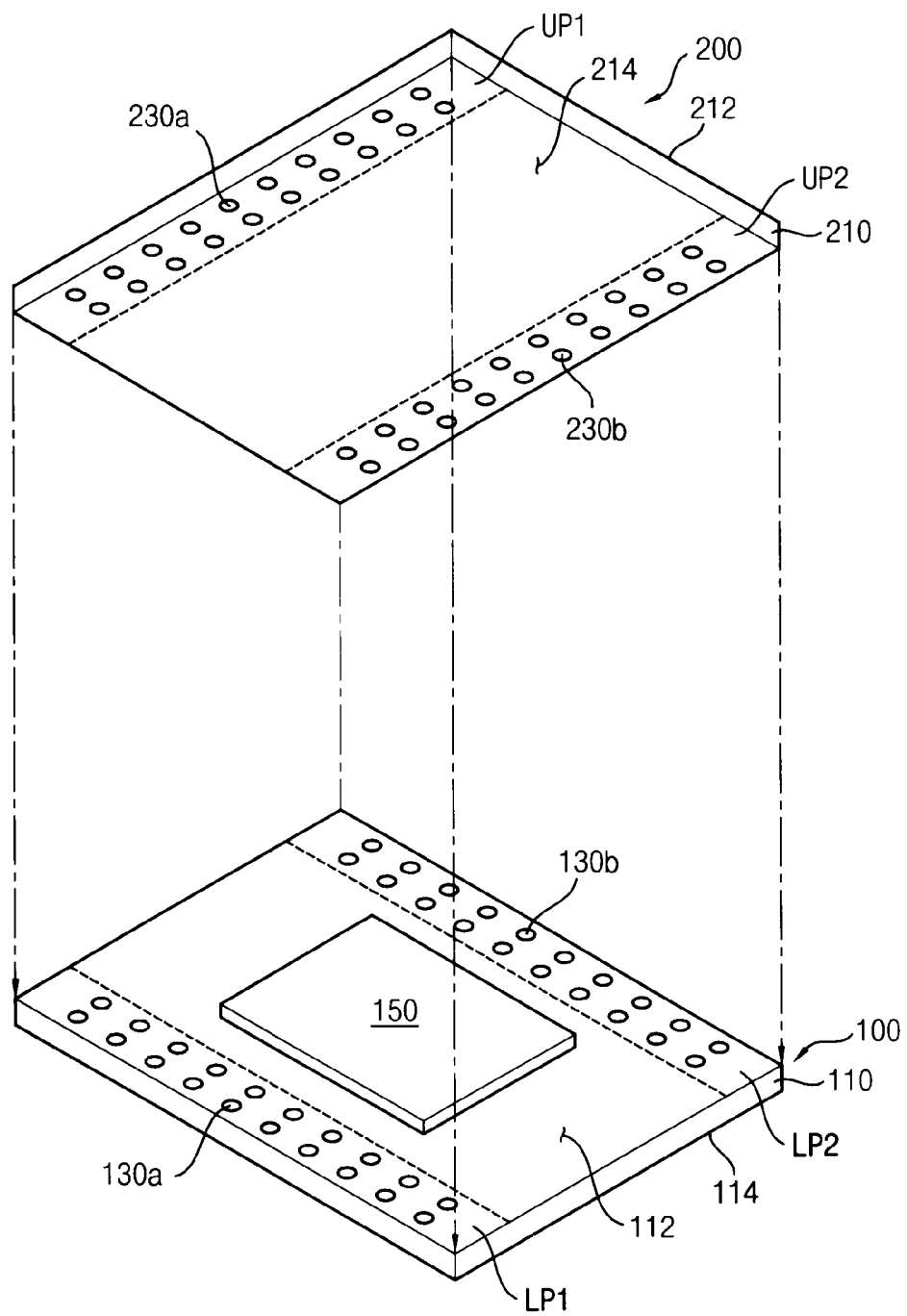
Figure 13:
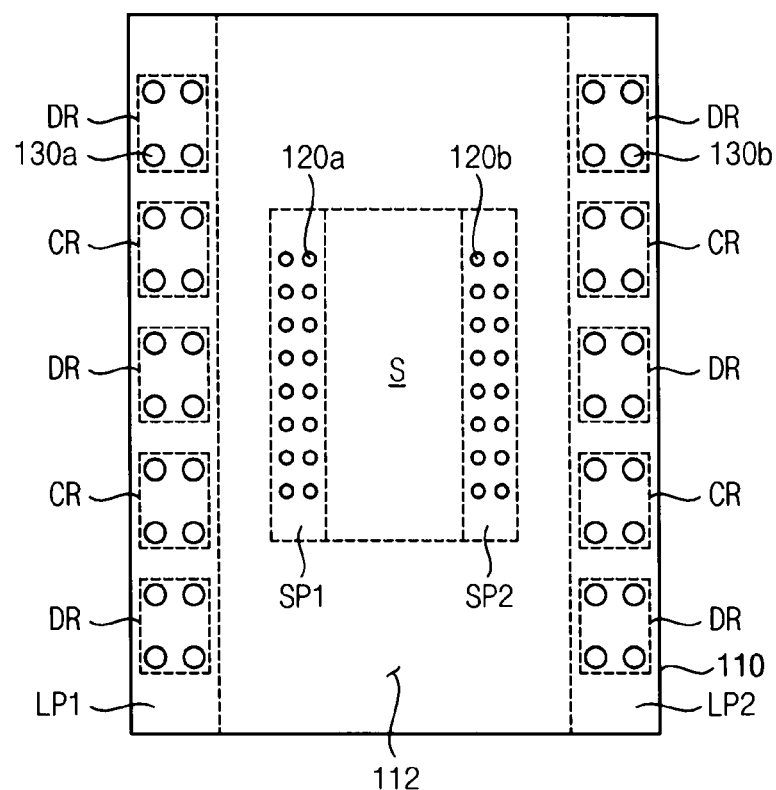
Figure 14:
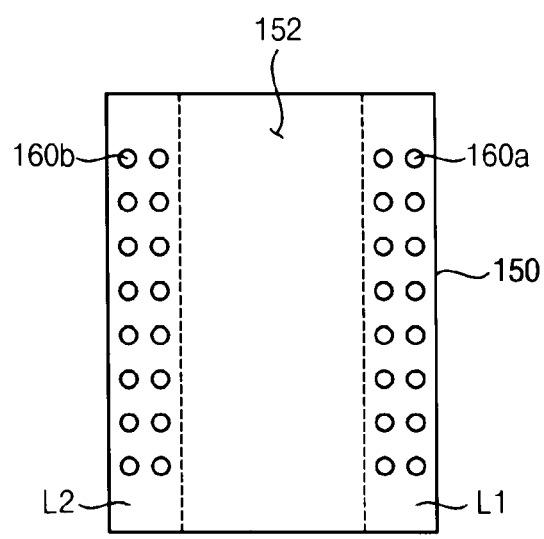
Figure 15:
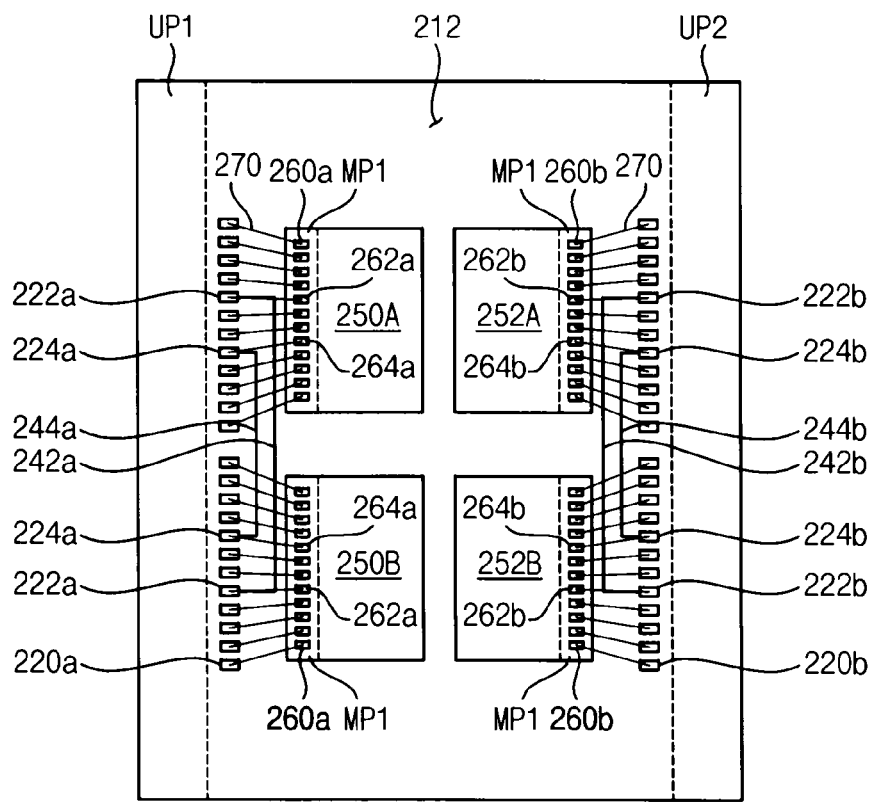
Figure 16:
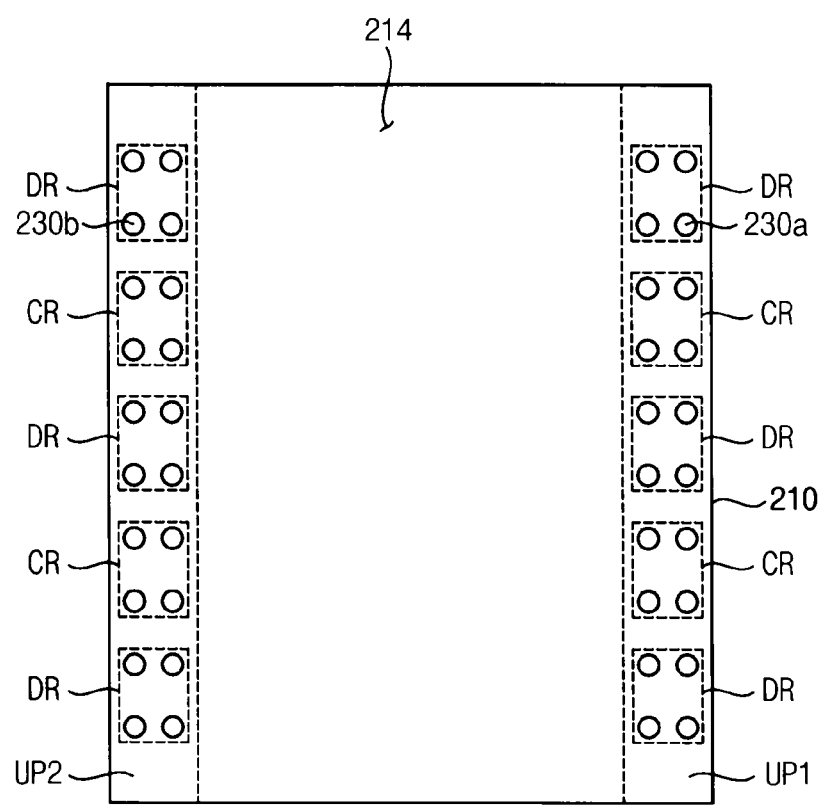

FIG. 10 is a perspective view illustrating a stack semiconductor package in accordance with example embodiments. FIGS. 11 and 12 are exploded perspective views illustrating the stack semiconductor package of FIG. 10. FIG. 13 is a plan view illustrating a first package substrate of a first semiconductor package of FIG. 10. FIG. 14 is a bottom view illustrating a first semiconductor chip mounted on the first package substrate of FIG. 13. FIG. 15 is a plan view illustrating a second package substrate of a second semiconductor package of FIG. 10. FIG. 16 is a bottom view illustrating the second package substrate of FIG. 15.

The stack semiconductor package of FIGS. 10 to 16 may be substantially the same as or similar to the stack semiconductor package described with reference to FIGS. 1 to 9, except for the number of semiconductor chips mounted on a second package substrate and an arrangement of connection wires thereof. Thus, same reference numerals are used to refer to the same or like elements as those described in the package described with reference to FIGS. 1 to 9, and a detailed description of such elements is not repeated.

Referring to FIGS. 10 to 16, a stack semiconductor package 11 may be a System-In-Package (SIP) type semiconductor package where semiconductor chips that can perform various functions (for example, a memory chip and a logic chip) are integrated into one package. The stack semiconductor package 11 may include a first semiconductor package 100 and a second semiconductor package 200 stacked on the first semiconductor package 100.

In example embodiments, the second semiconductor package 200 may include a second package substrate 210. The second semiconductor package 200 may include a first sub-chip 250A, a second sub-chip 250B, a third sub-chip 252A and a fourth sub-chip 252B mounted on the second package substrate 210.

As illustrated in FIG. 15, the first and second sub-chips 250A and 250B may be arranged side by side extending along a direction of a first side portion UP1 of the second package substrate 210. The third and fourth sub-chips 252A and 252B may be arranged side by side extending along a direction of a second side portion UP2 of the second package substrate 210 opposite to the first side portion UP1. The first and second sub-chips 250A and 250B may be arranged adjacent to the first side portion UP1, and the third and fourth sub-chips 252A and 252B may be arranged adjacent to the second side portion UP2.

The first sub-chip 250A and the second sub-chip 250B may be electrically connected to each other to constitute one first memory chip. That is, the first and second sub-chips 250A and 250B may be bisection chips, which are bisected from one memory chip, for example, an LPDDR4 memory chip. The third sub-chip 252A and the fourth sub-chip 252B may be electrically connected to each other to constitute one second memory chip. That is, the third and fourth sub-chips 252A and 252B may be bisection chips, which are bisected from one memory chip, for example, an LPDDR4 memory chip.

The first sub-chip 250A may have a plurality of second chip pads 260a on an active surface thereof. The second chip pads 260a may be arranged along a first side portion MP1 on the active surface of the first sub-chip 250A. Similar to the first sub-chip 250A, a plurality of second chip pads 260a of the second sub-chip 250B may be arranged along a first side portion MP1 on an active surface of the second sub-chip 250B.

The third sub-chip 252A may have a plurality of second chip pads 260b on an active surface thereof. The second chip pads 260b may be arranged along a first side portion MP1 on the active surface of the third sub-chip 252A. Similar to the third sub-chip 252A, a plurality of second chip pads 260b of the fourth sub-chip 252B may be arranged along a first side portion MP1 on an active surface of the fourth sub-chip 250B.

A plurality of substrate pads 220a may be arranged adjacent to the second chip pads 260a of the first and second sub-chips 250A and 250B along the first side portion UP1 on an upper surface 212 of the second package substrate 210. A conductor (e.g., wire) 270 may be drawn from the substrate pad 220a to be connected to a chip pad from among the second chip pads 260a. It will be understood that each of a plurality of conductors (e.g., wires) 270 may be drawn from a corresponding substrate pad (e.g., 220a) to be connected to a corresponding chip pad from among the second chip pads 260a.

A plurality of substrate pads 220b may be arranged adjacent to the second chip pads 260b of the third and fourth sub-chips 252A and 252B along a second side portion UP2 on the upper surface 212 of the second package substrate 210. A conductor (e.g., wire) 270 may be drawn from the substrate pad 220b to be connected to a chip pad from among the second chip pads 260b. It will be understood that each of a plurality of conductors (e.g., wires) 270 may be drawn from a corresponding substrate pad (e.g., 220b) to be connected to a corresponding chip pad from among the second chip pads 260b.

A first connection memory pad 262a of the first sub-chip 250A may be electrically connected to a first connection substrate pad 222a on the upper surface 212 of the second package substrate 210 by a conductor (e.g., wire) 270. A second connection memory pad 264a of the first sub-chip 250A may be electrically connected to a second connection substrate pad 224a on the upper surface 212 of the second package substrate 210 by a conductor (e.g., wire) 270.

A first connection memory pad 262a of the second sub-chip 250B may be electrically connected to a first connection substrate pad 222a on the upper surface 212 of the second package substrate 210 by a conductor (e.g., wire) 270. A second connection memory pad 264a of the second sub-chip 250B may be electrically connected to a second connection substrate pad 224a on the upper surface 212 of the second package substrate 210 by a conductor (e.g., wire) 270.

The first connection substrate pads 222a may be electrically connected to each other by a first connection conductor (e.g., wire) 242a in the second package substrate 210. The second connection substrate pads 224a may be electrically connected to each other by a second connection conductor (e.g., wire) 244a in the second package substrate 210. Thus, the first sub-chip 250A and the second sub-chip 250B may be electrically connected to each other by the connection conductors (e.g., wires) 242a and 244a in the second package substrate 210 to constitute one first memory chip.

A first connection memory pad 262b of the third sub-chip 252A may be electrically connected to a first connection substrate pad 222b on the upper surface 212 of the second package substrate 210 by a conductor (e.g., wire) 270. A second connection memory pad 264b of the third sub-chip 252A may be electrically connected to a second connection substrate pad 224b on the upper surface 212 of the second package substrate 210 by a conductor (e.g., wire) 270.

A first connection memory pad 262b of the fourth sub-chip 252B may be electrically connected to a first connection substrate pad 222b on the upper surface 212 of the second package substrate 210 by a conductor (e.g., wire) 270. A second connection memory pad 264b of the fourth sub-chip 252B may be electrically connected to a second connection substrate pad 224b on the upper surface 212 of the second package substrate 210 by a conductor (e.g., wire) 270.

The first connection substrate pads 222b may be electrically connected to each other by a first connection conductor (e.g., wire) 242b in the second package substrate 210. The second connection substrate pads 224b may be electrically connected to each other by a second connection conductor (e.g., wire) 244b in the second package substrate 210. Thus, the third sub-chip 252A and the fourth sub-chip 252B may be electrically connected to each other by the connection conductors (e.g., wires) 242b and 244b in the second package substrate 210 to constitute one second memory chip.

As illustrated in FIG. 14, a first semiconductor chip 150 may have a plurality of first chip pads 160a and 160b on an active surface 152 thereof. The first chip pads 160a may be arranged along a first side portion L1 on the active surface 152 of the first semiconductor chip 150. The first chip pads 160b may be arranged along a second side portion L2 opposite to the first side portion L1 on the active surface 152 of the first semiconductor chip 150. The first chip pads 160a arranged along the first side portion L1 of the first semiconductor chip 150 may constitute one control channel for controlling the first memory chip (e.g., 250A and 250B) of the second semiconductor package 200. The first chip pads 160b arranged along the second side portion L2 of the first semiconductor chip 150 may constitute one control channel for controlling the second memory chip (e.g., 252A and 252B) of the second semiconductor package 200.

As illustrated in FIG. 13, a plurality of bump pads 120a, 120b and a plurality of first connection pads 130a, 130b may be formed on the upper surface 112 of the first package substrate 110. The bump pads 120a may be arranged along a first side portion SP1 of a chip mounting region S corresponding to the first chip pads 160a (of FIG. 14) to constitute a first interface portion. The first interface portion may be a physical terminal (PHY), which is disposed along the first side portion SP1 of the chip mounting region S.

The bump pads 120b may be arranged along a second side portion SP2 opposite to the first side portion SP1 of the chip mounting region S corresponding to the first chip pads 160b (of FIG. 14) to constitute a second interface portion. The second interface portion may be a physical terminal (PHY), which is disposed along the second side portion SP2 of the chip mounting region S.

The first connection pads 130a may be arranged adjacent to the first interface portion along a first side portion LP1 on the upper surface 112 of the first package substrate 110. The first connection pads 130a may be electrically connected to the bump pads 120a through substrate conductors (e.g., wires) in the first package substrate 110. Accordingly, the first connection pads 130a may be electrically connected to the first control channel, that is, the first chip pads 160a of the first semiconductor chip 150 through the substrate conductors (e.g., wires).

The first connection pads 130b may be arranged adjacent to the second interface portion along a second side portion LP2 opposite to the first side portion LP1 on the upper surface 112 of the first package substrate 110. The first connection pads 130b may be electrically connected to the bump pads 120b through substrate conductors (e.g., wires) in the first package substrate 110. Accordingly, the first connection pads 130b may be electrically connected to the second control channel, that is, the first chip pads 160b of the first semiconductor chip 150 through the substrate conductors (e.g., wires).

As illustrated in FIG. 16, a plurality of second connection pads 230a and 230b may be formed on a lower surface 214 of the second package substrate 210. The second connection pads 230a may be arranged corresponding to the first connection pads 130a along the first side portion UP1 on the lower surface 214 of the second package substrate 210. The second connection pads 230a may be electrically connected to the substrate pads 220a through substrate conductors (e.g., wires) in the second package substrate 210. Accordingly, the second connection pads 230a may be electrically connected to the second chip pads 260a of the first and second sub-chips 250A and 250B through the substrate conductors (e.g., wires).

The second connection pads 230b may be arranged corresponding to the first connection pads 130b along the second side portion UP2 opposite to the first side portion UP1 on the lower surface 214 of the second package substrate 210. The second connection pads 230b may be electrically connected to the substrate pads 220b through substrate conductors (e.g., wires) in the second package substrate 210. Accordingly, the second connection pads 230b may be electrically connected to the second chip pads 260b of the third and fourth sub-chips 252A and 252B through the substrate conductors (e.g., wires).

First solder balls 300 (of FIG. 10) may be arranged between the first connection pads 130a, 130b (of FIG. 13) and the second connection pads 230a, 230b (of FIG. 16) to electrically connect the first package substrate 110 (of FIG. 10) and the second package substrate 210 (of FIG. 10). Accordingly, the first control channel, that is, the first chip pads 160a of the first semiconductor chip 150 (of FIG. 14) may be electrically connected to the second chip pads 260a of the first and second sub-chips 250A and 250B (of FIG. 15) through the first solder balls 300 (of FIG. 10). The second control channel, that is, the first chip pads 160b of the first semiconductor chip 150 (of FIG. 14) may be electrically connected to the second chip pads 260b of the third and fourth sub-chips 252A and 252B (of FIG. 15) through the first solder balls 300 (of FIG. 10).

As mentioned above, the bump pads 120a of the first package substrate 110 constituting the first interface portion may be arranged along the first side portion SP1 of the chip mounting region S. The first connection pads 130a may be arranged adjacent to the bump pads 120a along the first side portion LP1 of the first package substrate 110. Accordingly, connection wiring paths between the first interface portion and the first connection pads 130a may be reduced and simplified, thereby reducing or preventing electrical interferences between connection conductors (e.g., wires).

Additionally, the bump pads 120b of the first package substrate 110 constituting the second interface portion may be arranged along the second side portion SP2 of the chip mounting region S. The first connection pads 130b may be arranged adjacent to the bump pads 120b along the second side portion LP2 of the first package substrate 110. Accordingly, connection wiring paths between the second interface portion and the first connection pads 130b may be reduced and simplified, thereby reducing or preventing electrical interferences between connection conductors (e.g., wires).

Further, the second connection pads 230a and 230b, which are electrically connected to the bisection sub-chips 250A, 250B and 252A, 252B, may be arranged along the first and second side portions UP1 and UP2, respectively. The first and second side portions UP1 and UPS2 of the second package substrate 210 may be arranged opposite to each other, thereby preventing the stack semiconductor package from being lengthened in a longitudinal direction.

Figure 17:
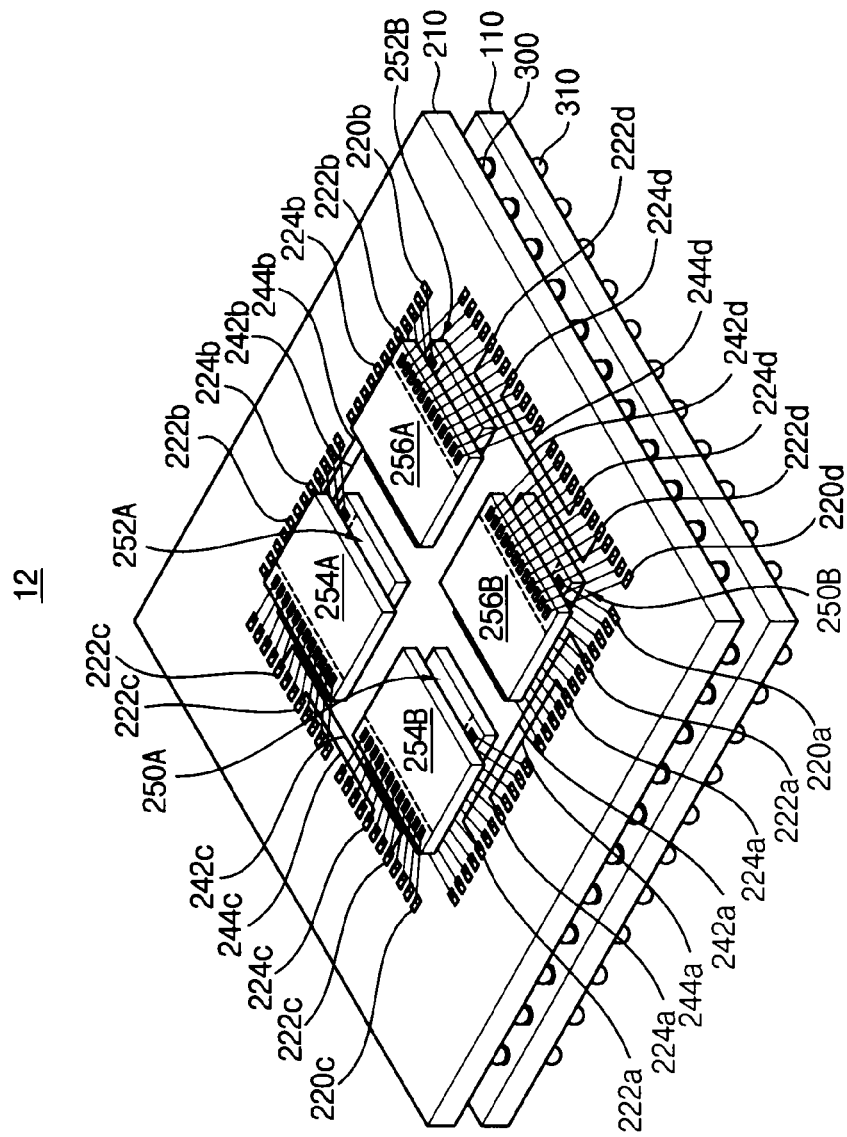
Figure 18:
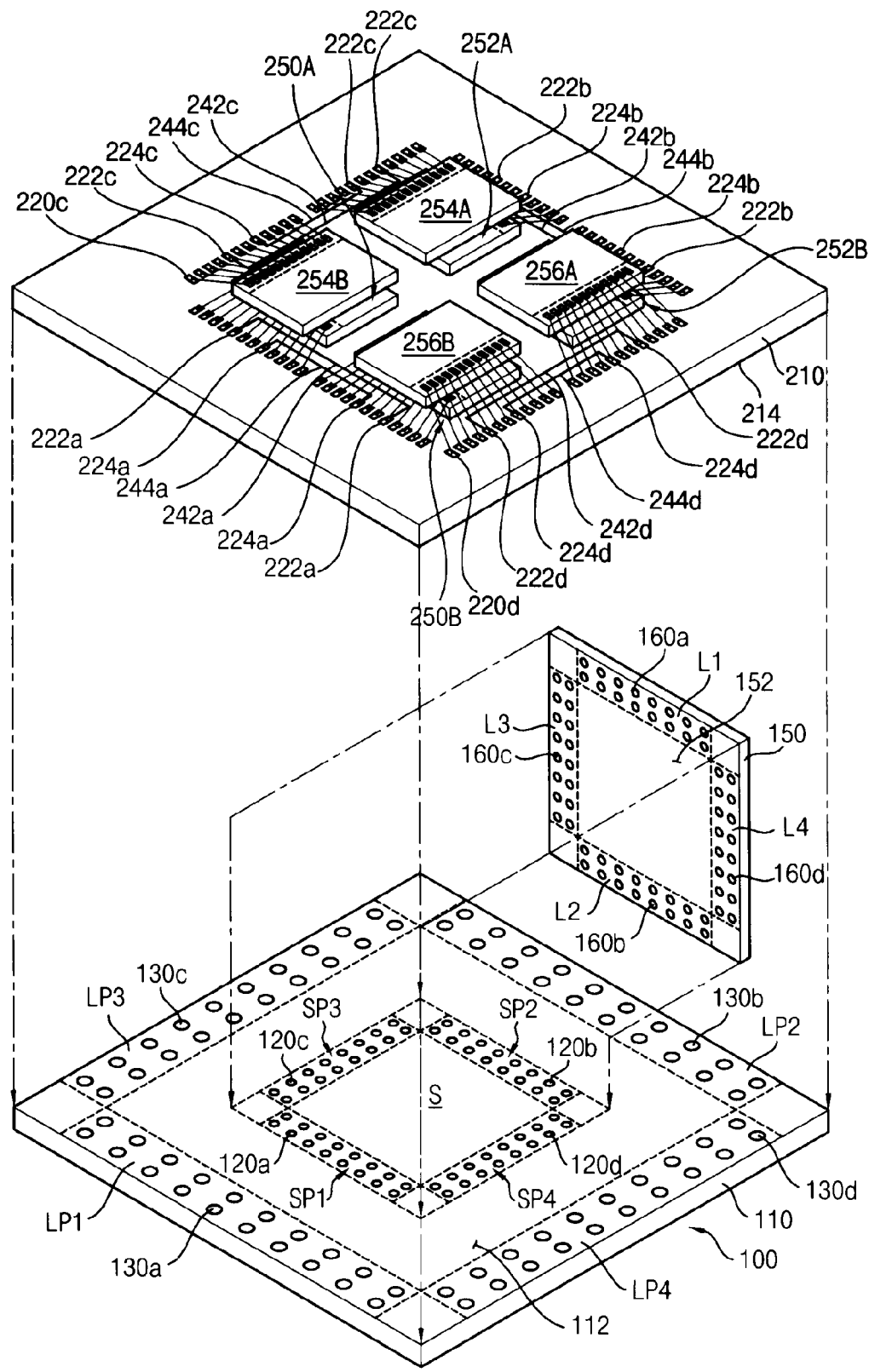
Figure 19:
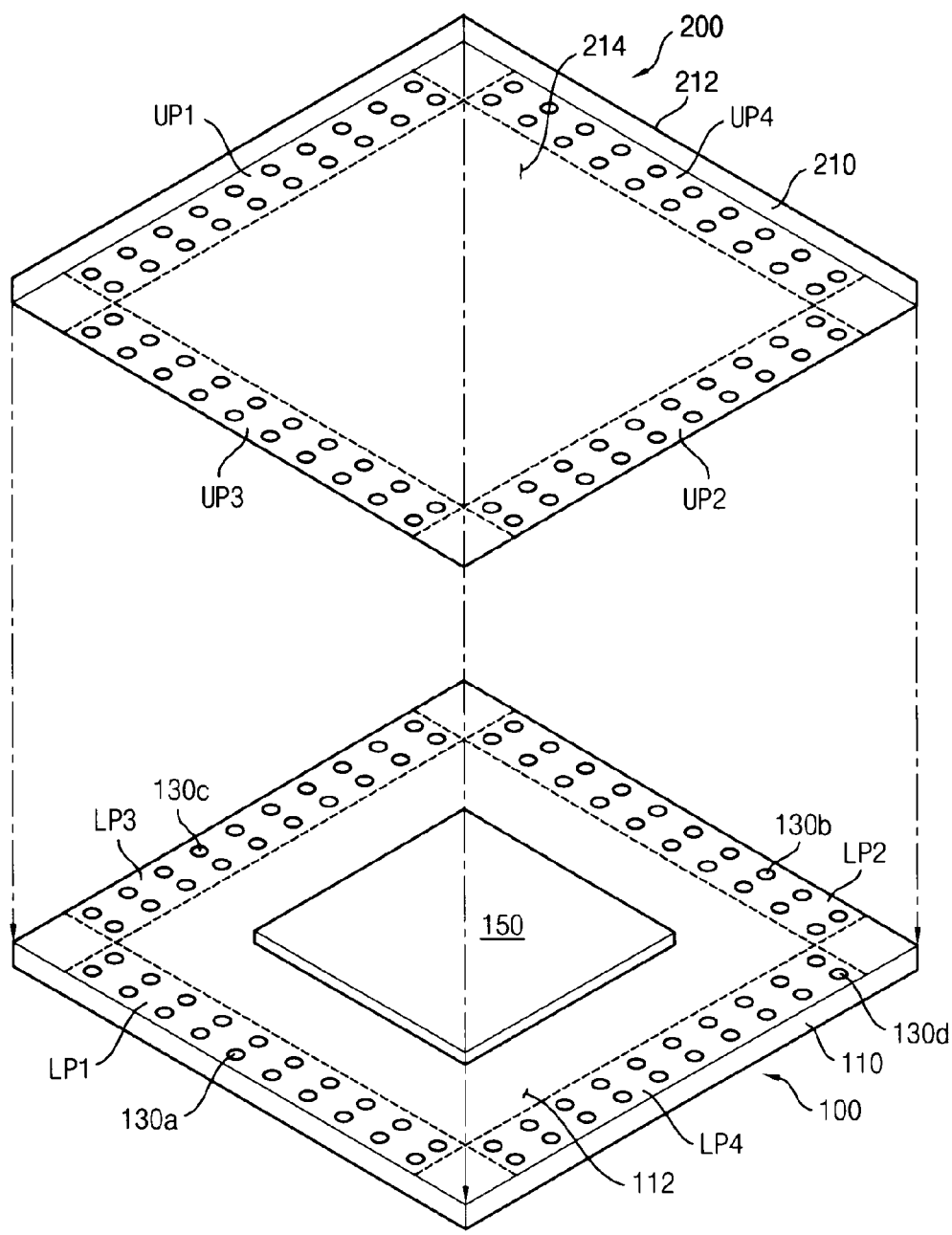
Figure 20:
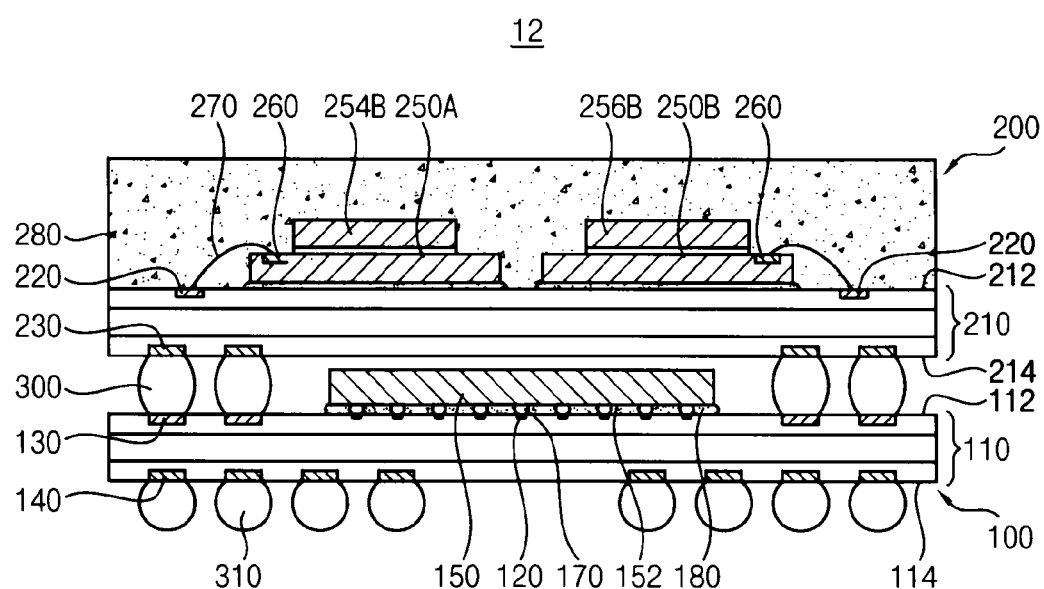
Figure 21:
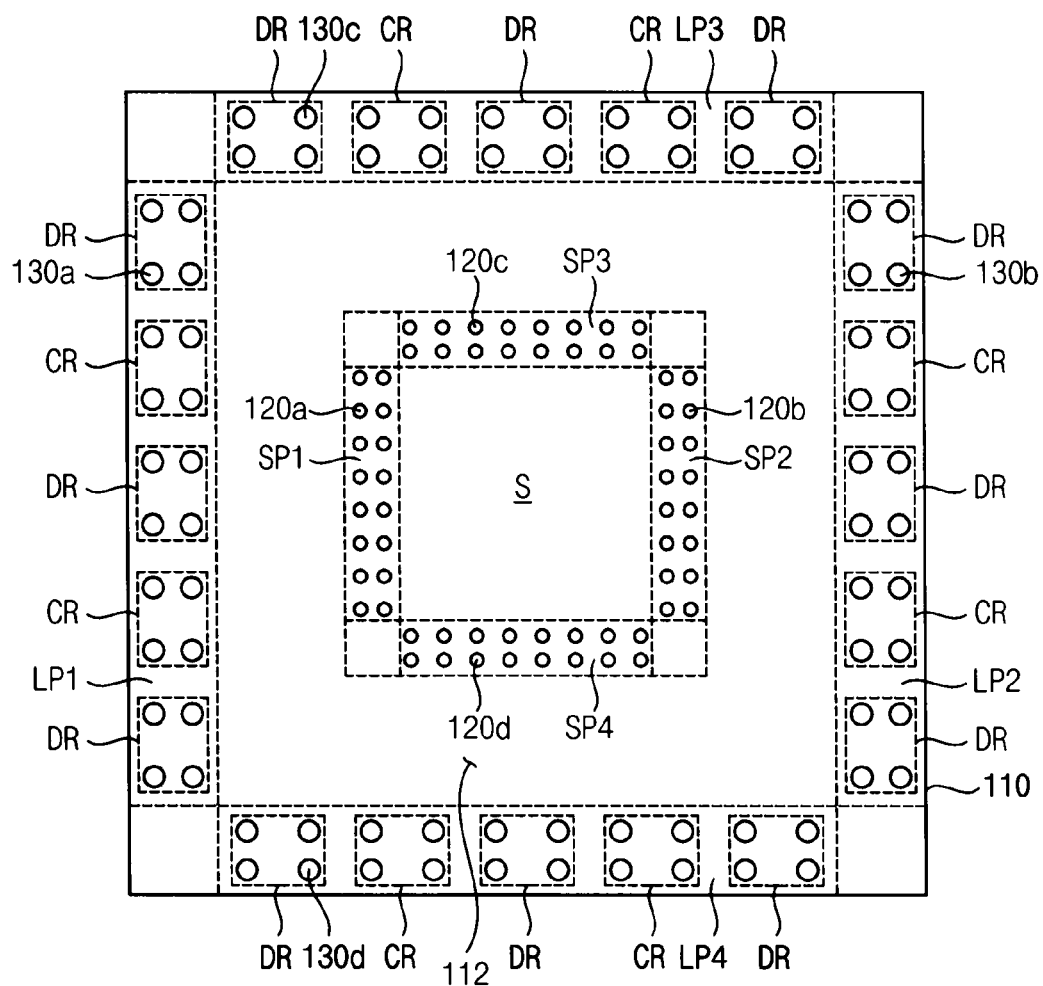
Figure 22:
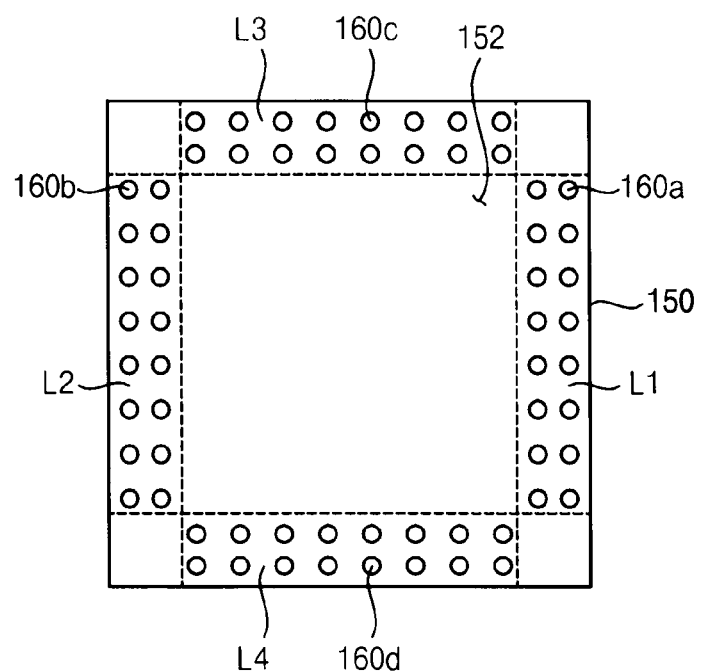
Figure 23:
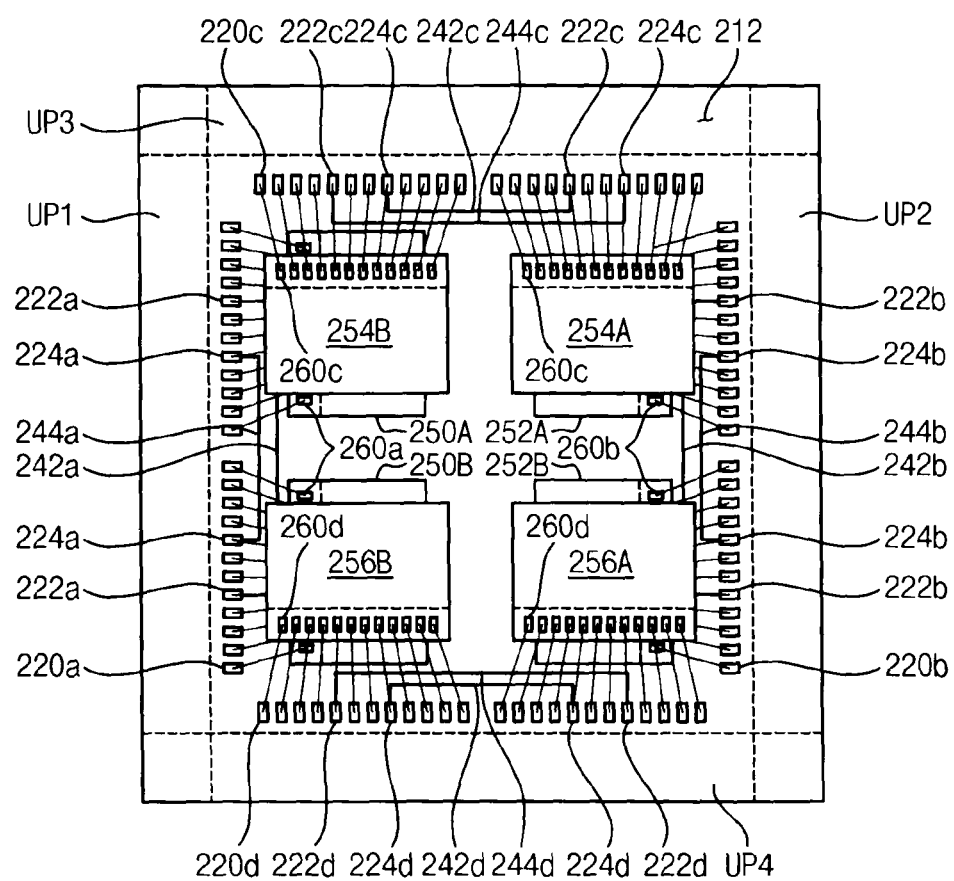
Figure 24:
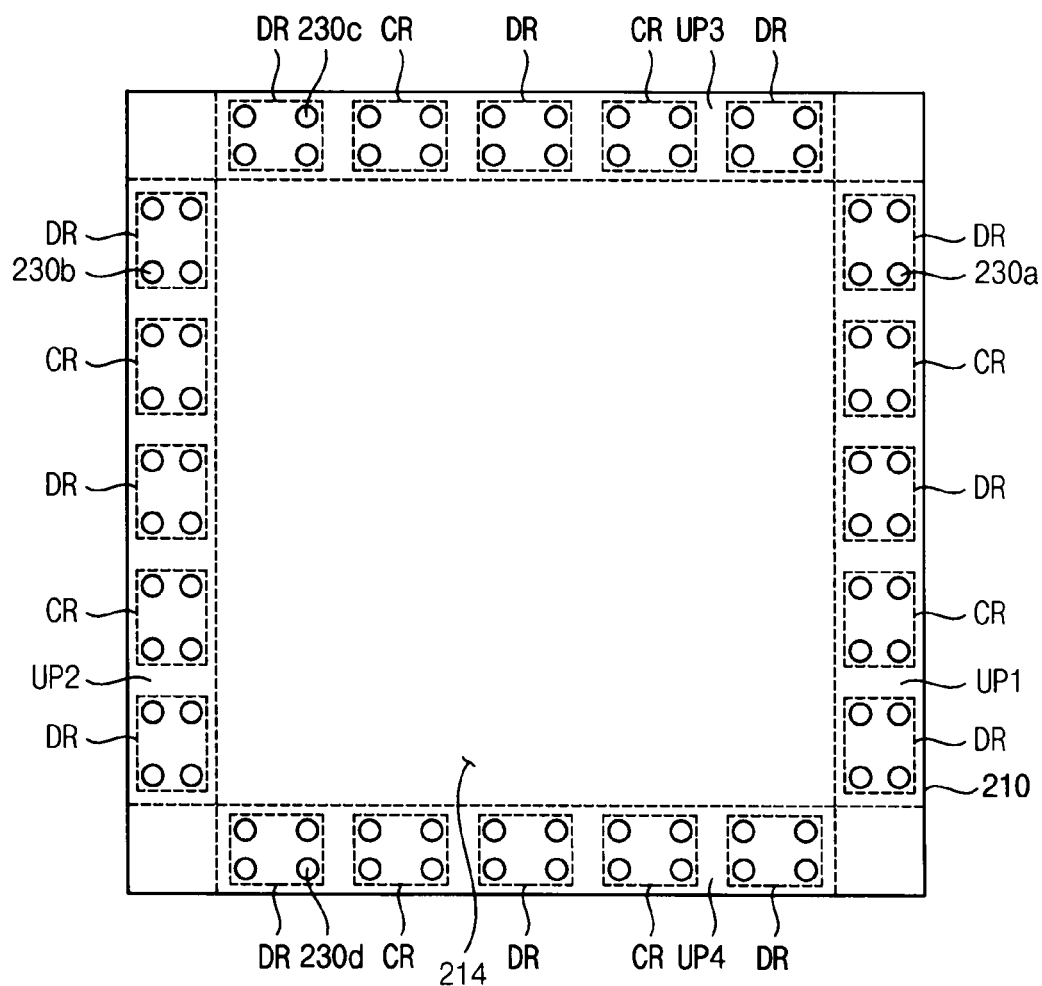

FIG. 17 is a perspective view illustrating a stack semiconductor package in accordance with example embodiments. FIGS. 18 and 19 are exploded perspective views illustrating the stack semiconductor package of FIG. 17. FIG. 20 is a cross-sectional view illustrating the stack semiconductor package of FIG. 17. FIG. 21 is a plan view illustrating a first package substrate of a first semiconductor package of FIG. 17. FIG. 22 is a bottom view illustrating a first semiconductor chip mounted on the first package substrate of FIG. 21. FIG. 23 is a plan view illustrating a second package substrate of a second semiconductor package of FIG. 17. FIG. 24 is a bottom view illustrating the second package substrate of FIG. 23. The stack semiconductor package may be substantially the same as or similar to the stack semiconductor package described with reference to FIGS. 10 to 16, except for the number of semiconductor chips mounted on a second package substrate and an arrangement of connection conductors (e.g., wires) thereof. Thus, same reference numerals are used to refer to the same or like elements as those described in the package described with reference to FIGS. 10 to 16, and a detailed description of such elements is not repeated.

Referring to FIGS. 17 to 24, a stack semiconductor package 12 may be a System-In-Package (SIP) type semiconductor package where semiconductor chips that can perform various functions (for example, a memory chip and a logic chip) are integrated into one package. The stack semiconductor package 12 may include a first semiconductor package 100 and a second semiconductor package 200 stacked on the first semiconductor package 100.

In example embodiments, the second semiconductor package 200 may include a second package substrate 210. The second semiconductor package 200 may include a first sub-chip 250A, a second sub-chip 250B, a third sub-chip 252A, a fourth sub-chip 252B, a fifth sub-chip 254A, a sixth sub-chip 254B, a seventh sub-chip 256A and an eighth sub-chip 256B mounted on the second package substrate 210.

As illustrated in FIG. 23, the first and second sub-chips 250A and 250B may be arranged side by side extending along a direction of a first side portion UP1 of the second package substrate 210. The third and fourth sub-chips 252A and 252B may be arranged side by side extending along a direction of a second side portion UP2 of the second package substrate 210 opposite to the first side portion UP1. The fifth and sixth sub-chips 254A and 254B may be arranged side by side extending along a direction of a third side portion UP3 of the second package substrate 210 adjacent to the first side portion UP1. The seventh and eighth sub-chips 256A and 256B may be arranged side by side extending along a direction of a fourth side portion UP4 of the second package substrate 210 adjacent to the first side portion UP1 and opposite to the third side portion UP3.

The first and second sub-chips 250A and 250B may be arranged adjacent to the first side portion UP1, the third and fourth sub-chips 252A and 252B may be arranged adjacent to the second side portion UP2, the fifth and sixth sub-chips 254A and 254B may be arranged adjacent to the third side portion UP3, and the seventh and eighth sub-chips 256A and 256B may be arranged adjacent to the fourth side portion UP4.

The sixth sub-chip 254B may be stacked on the first sub-chip 250A. The sixth sub-chip 254B and the first sub-chip 250A may be arranged to cross each other. The eighth sub-chip 256B may be stacked on the second sub-chip 250B. The eighth sub-chip 256B and the second sub-chip 250B may be arranged to cross each other. The fifth sub-chip 254A may be stacked on the third sub-chip 252A. The fifth sub-chip 254A and the third sub-chip 252A may be arranged to cross each other. The seventh sub-chip 256A may be stacked on the fourth sub-chip 252B. The seventh sub-chip 256A and the fourth sub-chip 252B may be arranged to cross each other.

The first sub-chip 250A and the second sub-chip 250B may be electrically connected to each other to constitute one first memory chip. That is, the first and second sub-chips 250A and 250B may be bisection chips, which are bisected from one memory chip, for example, an LPDDR4 memory chip. The third sub-chip 252A and the fourth sub-chip 252B may be electrically connected to each other to constitute one second memory chip. That is, the third and fourth sub-chips 252A and 252B may be bisection chips, which are bisected from one memory chip, for example, an LPDDR4 memory chip. The fifth sub-chip 254A and the sixth sub-chip 254B may be electrically connected to each other to constitute one third memory chip. That is, the fifth and sixth sub-chips 254A and 254B may be bisection chips, which are bisected from one memory chip, for example, an LPDDR4 memory chip. The seventh sub-chip 256A and the eighth sub-chip 256B may be electrically connected to each other to constitute one fourth memory chip. That is, the seventh and eighth sub-chips 256A and 256B may be bisection chips, which are bisected from one memory chip, for example, an LPDDR4 memory chip.

A plurality of substrate pads 220a may be arranged adjacent to second chip pads 260a of the first and second sub-chips 250A and 250B along the first side portion UP1 on an upper surface 212 of the second package substrate 210. A conductor (e.g., wire) 270 may be drawn from the substrate pad 220a to be connected to a chip pad from among the second chip pads 260a. It will be understood that each of a plurality of conductors (e.g., wires) 270 may be drawn from a corresponding substrate pad (e.g., 220a) to be connected to a corresponding chip pad from among the second chip pads 260a.

A plurality of substrate pads 220b may be arranged adjacent to second chip pads 260b of the third and fourth sub-chips 252A and 252B along the first side portion UP1 on the upper surface 212 of the second package substrate 210. A conductor (e.g., wire) 270 may be drawn from the substrate pad 220b to be connected to a chip pad from among the second chip pads 260b. It will be understood that each of a plurality of conductors (e.g., wires) 270 may be drawn from a corresponding substrate pad (e.g., 220b) to be connected to a corresponding chip pad from among the second chip pads 260b.

A plurality of substrate pads 220c may be arranged adjacent to second chip pads 260c of the fifth and sixth sub-chips 254A and 254B along the third side portion UP3 on the upper surface 212 of the second package substrate 210. A conductor (e.g., wire) 270 may be drawn from the substrate pad 220c to be connected to a chip pad from among the second chip pads 260c. It will be understood that each of a plurality of conductors (e.g., wires) 270 may be drawn from a corresponding substrate pad (e.g., 220c) to be connected to a corresponding chip pad from among the second chip pads 260c.

A plurality of substrate pads 220d may be arranged adjacent to second chip pads 260d of the seventh and eighth sub-chips 256A and 256B along the fourth side portion UP4 on the upper surface 212 of the second package substrate 210. A conductor (e.g., wire) 270 may be drawn from the substrate pad 220d to be connected to a chip pad from among the second chip pads 260d. It will be understood that each of a plurality of conductors (e.g., wires) 270 may be drawn from a corresponding substrate pad (e.g., 220d) to be connected to a corresponding chip pad from among the second chip pads 260d.

A first connection memory pad 262a of the first sub-chip 250A may be electrically connected to a first connection substrate pad 222a on the upper surface 212 of the second package substrate 210 by a conductor (e.g., wire) 270. A second connection memory pad 264a of the first sub-chip 250A may be electrically connected to a second connection substrate pad 224a on the upper surface 212 of the second package substrate 210 by a conductor (e.g., wire) 270.

A first connection memory pad 262a of the second sub-chip 250B may be electrically connected to a first connection substrate pad 222a on the upper surface 212 of the second package substrate 210 by a conductor (e.g., wire) 270. A second connection memory pad 264a of the second sub-chip 250B may be electrically connected to a second connection substrate pad 224a on the upper surface 212 of the second package substrate 210 by a conductor (e.g., wire) 270.

The first connection substrate pads 222a may be electrically connected to each other by a first connection conductor (e.g., wire) 242a in the second package substrate 210. The second connection substrate pads 224a may be electrically connected to each other by a second connection conductor (e.g., wire) 244a in the second package substrate 210. Thus, the first sub-chip 250A and the second sub-chip 250B may be electrically connected to each other by the connection conductors (e.g., wires) 242a and 244a in the second package substrate 210 to constitute one first memory chip.

A first connection memory pad 262b of the third sub-chip 252A may be electrically connected to a first connection substrate pad 222b on the upper surface 212 of the second package substrate 210 by a conductor (e.g., wire) 270. A second connection memory pad 264b of the third sub-chip 252A may be electrically connected to a second connection substrate pad 224b on the upper surface 212 of the second package substrate 210 by a conductor (e.g., wire) 270.

A first connection memory pad 262b of the fourth sub-chip 252B may be electrically connected to a first connection substrate pad 222b on the upper surface 212 of the second package substrate 210 by a conductor (e.g., wire) 270. A second connection memory pad 264b of the fourth sub-chip 252B may be electrically connected to a second connection substrate pad 224b on the upper surface 212 of the second package substrate 210 by a conductor (e.g., wire) 270.

A first connection memory pad from among the second chip pads 260c of the fifth sub-chip 254A may be electrically connected to a first connection substrate pad 222c on the upper surface 212 of the second package substrate 210 by a conductor (e.g., wire) 270. A second connection memory pad from among the second chip pads 260c of the fifth sub-chip 254A may be electrically connected to a second connection substrate pad 224c on the upper surface 212 of the second package substrate 210 by a conductor (e.g., wire) 270.

A first connection memory pad from among the second chip pads 260c of the sixth sub-chip 254B may be electrically connected to a first connection substrate pad 222c on the upper surface 212 of the second package substrate 210 by a conductor (e.g., wire) 270. A second connection memory pad from among the second chip pads 260c of the sixth sub-chip 254B may be electrically connected to a second connection substrate pad 224c on the upper surface 212 of the second package substrate 210 by a conductor (e.g., wire) 270.

The first connection substrate pads 222c may be electrically connected to each other by a first connection conductor (e.g., wire) 242c in the second package substrate 210. The second connection substrate pads 224c may be electrically connected to each other by a second connection conductor (e.g., wire) 244c in the second package substrate 210. Thus, the fifth sub-chip 254A and the sixth sub-chip 254B may be electrically connected to each other by the connection conductors (e.g., wires) 242c and 244c in the second package substrate 210 to constitute one first memory chip.

A first connection memory pad from among the second chip pads 260d of the seventh sub-chip 256A may be electrically connected to a first connection substrate pad 222d on the upper surface 212 of the second package substrate 210 by a conductor (e.g., wire) 270. A second connection memory pad from among the second chip pads 260d of the seventh sub-chip 256A may be electrically connected to a second connection substrate pad 224*d* on the upper surface 212 of the second package substrate 210 by a conductor (e.g., wire) 270.

A first connection memory pad from among the second chip pads 260*d* of the eighth sub-chip 256B may be electrically connected to a first connection substrate pad 222*d* on the upper surface 212 of the second package substrate 210 by a conductor (e.g., wire) 270. A second connection memory pad from among the second chip pads 260*d* of the eighth sub-chip 256B may be electrically connected to a second connection substrate pad 224*d* on the upper surface 212 of the second package substrate 210 by a conductor (e.g., wire) 270.

The first sub-chip 250A and the second sub-chip 250B may be electrically connected to each other by connection conductors (e.g., wires) 242*a* and 244*a* in the second package substrate 210 to constitute one first memory chip. The third sub-chip 252A and the fourth sub-chip 252B may be electrically connected to each other by connection conductors (e.g., wires) 242*b* and 244*b* in the second package substrate 210 to constitute one second memory chip. The fifth sub-chip 254A and the sixth sub-chip 254B may be electrically connected to each other by connection conductors (e.g., wires) 242*c* and 244*c* in the second package substrate 210 to constitute one third memory chip. The seventh sub-chip 256A and the eighth sub-chip 256B may be electrically connected to each other by connection conductors (e.g., wires) 242*d* and 244*d* in the second package substrate 210 to constitute one fourth memory chip.

As illustrated in FIG. 22, a first semiconductor chip 150 may have a plurality of first chip pads 160*a*, 160*b*, 160*c* and 160*d* on an active surface 152 thereof. The first chip pads 160*a* may be arranged along a first side portion L1 on the active surface 152 of the first semiconductor chip 150. The first chip pads 160*b* may be arranged along a second side portion L2 opposite to the first side portion L1 on the active surface 152 of the first semiconductor chip 150. The first chip pads 160*c* may be arranged along a third side portion L3 adjacent to the first side portion L1 on the active surface 152 of the first semiconductor chip 150. The first chip pads 160*d* may be arranged along a fourth side portion L4 adjacent to the first side portion L1 and opposite to the third side portion L3 on the active surface 152 of the first semiconductor chip 150.

The first chip pads 160*a* arranged along the first side portion L1 of the first semiconductor chip 150 may constitute one control channel for controlling the first memory chip of the second semiconductor package 200. The first chip pads 160*b* arranged along the second side portion L2 of the first semiconductor chip 150 may constitute one control channel for controlling the second memory chip of the second semiconductor package 200. The first chip pads 160*c* arranged along the third side portion L3 of the first semiconductor chip 150 may constitute one control channel for controlling the third memory chip of the second semiconductor package 200. The first chip pads 160*d* arranged along the fourth side portion L4 of the first semiconductor chip 150 may constitute one control channel for controlling the fourth memory chip of the second semiconductor package 200.

As illustrated in FIG. 21, a plurality of bump pads 120*a*, 120*b*, 120*c*, 120*d* and a plurality of first connection pads 130*a*, 130*b*, 130*d*, 130*d* may be formed on an upper surface 112 of the first package substrate 110.

The bump pads 120*a* may be arranged along a first side portion SP1 of a chip mounting region S corresponding to the first chip pads 160*a* to constitute a first interface portion. The first interface portion may be a physical terminal (PHY), which is disposed along the first side portion SP1 of the chip mounting region S.

The bump pads 120*b* may be arranged along a second side portion SP2 opposite to the first side portion SP1 of the chip mounting region S corresponding to the first chip pads 160*b* to constitute a second interface portion. The second interface portion may be a physical terminal (PHY), which is disposed along the second side portion SP2 of the chip mounting region S.

The bump pads 120*c* may be arranged along a third side portion SP3 adjacent to the first side portion SP1 of the chip mounting region S corresponding to the first chip pads 160*c* to constitute a third interface portion. The third interface portion may be a physical terminal (PHY), which is disposed along the third side portion SP3 of the chip mounting region S.

The bump pads 120*d* may be arranged along a fourth side portion SP4 adjacent to the first side portion SP1 and opposite to the third side portion SP3 of the chip mounting region S corresponding to the first chip pads 160*d* to constitute a fourth interface portion. The fourth interface portion may be a physical terminal (PHY), which is disposed along the fourth side portion SP4 of the chip mounting region S.

The first connection pads 130*a* may be arranged adjacent to the first interface portion along a first side portion LP1 on the upper surface 112 of the first package substrate 110. The first connection pads 130*a* may be electrically connected to the bump pads 120*a* through substrate conductors (e.g., wires) in the first package substrate 110. Accordingly, the first connection pads 130*a* may be electrically connected to the first control channel, that is, the first chip pads 160*a* of the first semiconductor chip 150 through the substrate conductors (e.g., wires).

The first connection pads 130*b* may be arranged adjacent to the second interface portion along a second side portion LP2 opposite to the first side portion LP1 on the upper surface 112 of the first package substrate 110. The first connection pads 130*b* may be electrically connected to the bump pads 120*b* through substrate conductors (e.g., wires) in the first package substrate 110. Accordingly, the first connection pads 130*b* may be electrically connected to the second control channel, that is, the first chip pads 160*b* of the first semiconductor chip 150 through the substrate conductors (e.g., wires).

The first connection pads 130*c* may be arranged adjacent to the third interface portion along a third side portion LP3 adjacent to the first side portion LP1 on the upper surface 112 of the first package substrate 110. The first connection pads 130*c* may be electrically connected to the bump pads 120*c* through substrate conductors (e.g., wires) in the first package substrate 110. Accordingly, the first connection pads 130*c* may be electrically connected to the third control channel, that is, the first chip pads 160*c* of the first semiconductor chip 150 through the substrate conductors (e.g., wires).

The first connection pads 130*d* may be arranged adjacent to the fourth interface portion along a fourth side portion LP4 adjacent to the first side portion LP1 and opposite to the third side portion LP3 on the upper surface 112 of the first package substrate 110. The first connection pads 130*d* may be electrically connected to the bump pads 120*d* through substrate conductors (e.g., wires) in the first package substrate 110. Accordingly, the first connection pads 130*d* may be electrically connected to the third control channel, that is, the first chip pads 160*d* of the first semiconductor chip 150 through the substrate conductors (e.g., wires).

As illustrated in FIG. 24, a plurality of second connection pads 230*a*, 230*b*, 230*c* and 230*d* may be formed on a lower surface 214 of the second package substrate 210.

The second connection pads 230*a* may be arranged corresponding to the first connection pads 130*a* along the first side portion UP1 on the lower surface 214 of the second package substrate 210. The second connection pads 230*a* may be electrically connected to the substrate pads 220*a* through substrate conductors (e.g., wires) in the second package substrate 210. Accordingly, the second connection pads 230*a* may be electrically connected to the second chip pads 260*a* of the first and second sub-chips 250A and 250B through the substrate conductors (e.g., wires).

The second connection pads 230*b* may be arranged corresponding to the first connection pads 130*b* along the second side portion UP2 opposite to the first side portion UP1 on the lower surface 214 of the second package substrate 210. The second connection pads 230*b* may be electrically connected to the substrate pads 220*b* through substrate conductors (e.g., wires) in the second package substrate 210. Accordingly, the second connection pads 230*b* may be electrically connected to the second chip pads 260*b* of the third and fourth sub-chips 252A and 252B through the substrate conductors (e.g., wires).

The second connection pads 230*c* may be arranged corresponding to the first connection pads 130*c* along the third side portion UP3 adjacent to the first side portion UP1 on the lower surface 214 of the second package substrate 210. The second connection pads 230*c* may be electrically connected to the substrate pads 220*c* through substrate conductors (e.g., wires) in the second package substrate 210. Accordingly, the second connection pads 230*c* may be electrically connected to the second chip pads 260*c* of the fifth and sixth sub-chips 254A and 254B through the substrate conductors (e.g., wires).

The second connection pads 230*d* may be arranged corresponding to the first connection pads 130*d* along the fourth side portion UP4 adjacent to the first side portion UP1 and opposite to the third side portion UP3 on the lower surface 214 of the second package substrate 210. The second connection pads 230*d* may be electrically connected to the substrate pads 220*d* through substrate conductors (e.g., wires) in the second package substrate 210. Accordingly, the second connection pads 230*d* may be electrically connected to the second chip pads 260*d* of the seventh and eighth sub-chips 256A and 256B through the substrate conductors (e.g., wires).

First solder balls 300 (of FIG. 17) may be arranged between the first connection pads 130*a*, 130*b*, 130*c*, 130*d* (of FIG. 21) and the second connection pads 230*a*, 230*b*, 230*c*, 230*d* (of FIG. 24) to electrically connect the first package substrate 110 (of FIG. 17) and the second package substrate 210 (of FIG. 17). Accordingly, the first control channel, that is, the first chip pads 160*a* (of FIG. 22) of the first semiconductor chip 150 (of FIG. 22) may be electrically connected to the second chip pads 260*a* (of FIG. 23) of the first and second sub-chips 250A and 250B (of FIG. 23) through the first solder balls 300 (of FIG. 17). The second control channel, that is, the first chip pads 160*b* (of FIG. 22) of the first semiconductor chip 150 (of FIG. 22) may be electrically connected to the second chip pads 260*b* (of FIG. 23) of the third and fourth sub-chips 252A and 252B (of FIG. 23) through the first solder balls 300 (of FIG. 17). The third control channel, that is, the first chip pads 160*c* (of FIG. 22) of the first semiconductor chip 150 (of FIG. 22) may be electrically connected to the second chip pads 260*c* (of FIG. 23) of the fifth and sixth sub-chips 254A and 254B (of FIG. 23) through the first solder balls 300 (of FIG. 17). The fourth control channel, that is, the first chip pads 160*d* (of FIG. 22) of the first semiconductor chip 150 (of FIG. 22) may be electrically connected to the second chip pads 260*d* (of FIG. 23) of the seventh and eighth sub-chips 256A and 256B (of FIG. 23) through the first solder balls 300 (of FIG. 17).

As mentioned above, the bump pads 120*a* of the first package substrate 110 constituting the first interface portion may be arranged along the first side portion SP1 of the chip mounting region S. The first connection pads 130*a* may be arranged adjacent to the bump pads 120*a* along the first side portion LP1 of the first package substrate 110. The bump pads 120*b* of the first package substrate 110 constituting the second interface portion may be arranged along the second side portion SP2 of the chip mounting region S. The first connection pads 130*b* may be arranged adjacent to the bump pads 120*b* along the second side portion LP2 of the first package substrate 110. The bump pads 120*c* of the first package substrate 110 constituting the third interface portion may be arranged along the third side portion SP3 of the chip mounting region S. The first connection pads 130*c* may be arranged adjacent to the bump pads 120*c* along the third side portion LP3 of the first package substrate 110. The bump pads 120*d* of the first package substrate 110 constituting the fourth interface portion may be arranged along the fourth side portion SP4 of the chip mounting region S. The first connection pads 130*d* may be arranged adjacent to the bump pads 120*d* along the fourth side portion LP4 of the first package substrate 110.

Accordingly, connection wiring paths between the first to fourth interface portions and the first connection pads may be reduced and simplified, thereby reducing or preventing electrical interferences between connection conductors (e.g., wires).

Figure 25:
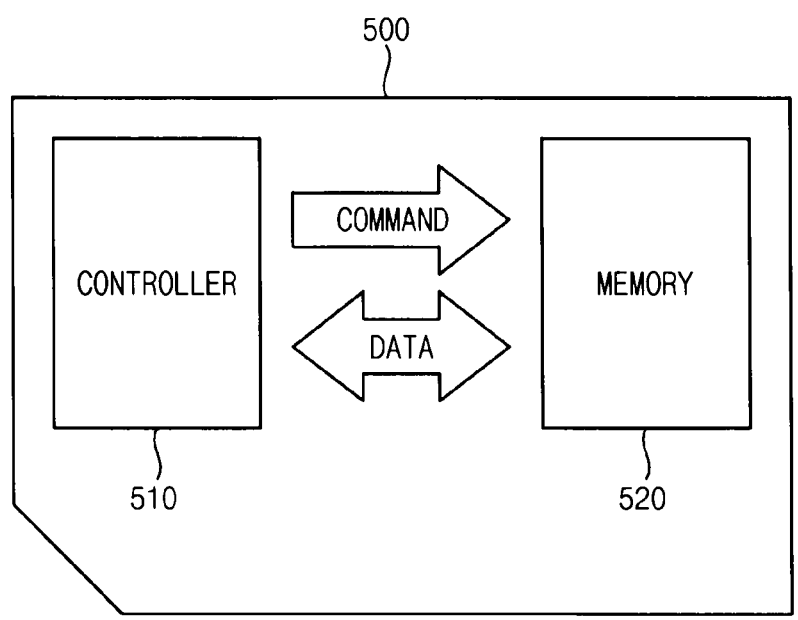

FIG. 25 is a block diagram illustrating a memory card including a stack semiconductor package in accordance with example embodiments.

Referring to FIG. 25, a memory card 500 may include a controller 510 and a memory 520, which exchange an electrical signal therebetween. For example, when the controller 510 outputs a command, the memory 520 may transmit data.

The controller 5100 and/or the memory 520 may include one of the stack semiconductor packages according to example embodiments described above. The memory 520 may include, for example, a memory array or a memory array bank.

The memory card 500 may be used in memory devices including, for example, a memory stick card, a smart media card (SM), a secure digital card (SD), a mini secure digital card (mini SD), or a multimedia card (MMC).

Figure 26:
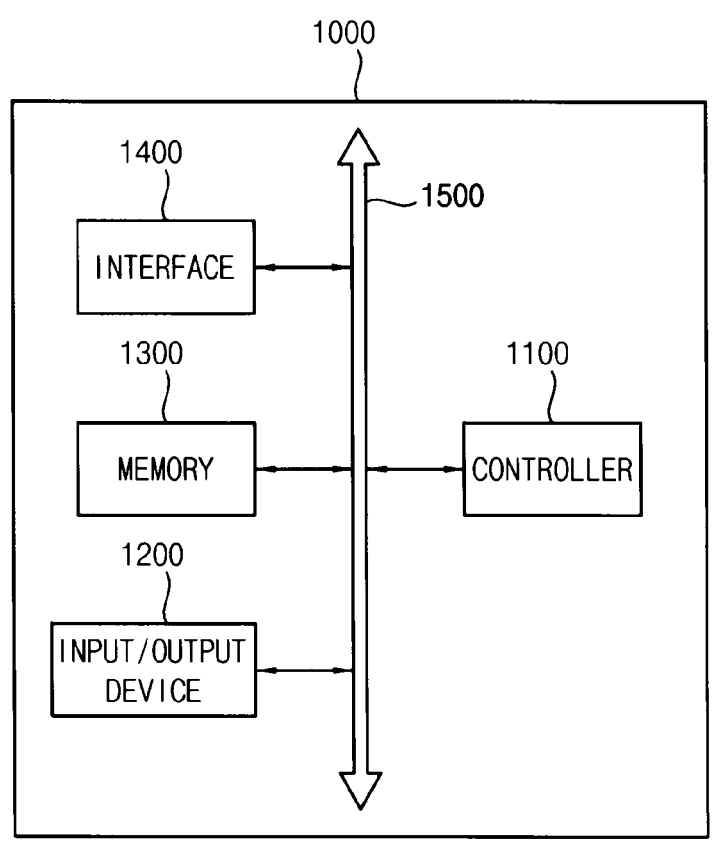

FIG. 26 is a block diagram illustrating an electronic system including a stack semiconductor package in accordance with example embodiments.

Referring to FIG. 26, an electronic system 1000 may include a controller 1100, an input/output device 1200, a memory 1300, and an interface 1400. The electronic system 1000 may be, for example, a mobile system or a system for transmitting or receiving information. The mobile system may include, for example, a personal digital assistant (PDA), a portable computer, a tablet computer, a wireless phone, a mobile phone, a digital music player, or a memory card.

The controller 1100 may execute a program and may control the electronic system 1000. For example, the controller 1100 may be a microprocessor, a digital signal processor, or a microcontroller. The input/output device 1200 may input or output data to or from the electronic system 1000.

The electronic system 1000 may be connected to an external device such as, for example, a personal computer or a network, and may exchange data with the external device using the input/output device 1200. The input/output device 1200 may be, for example, a keypad, a keyboard, or a display. The memory 1300 may store code and/or data used to operate the controller 1100, and/or may store data processed by the controller 1100. The controller 1100 and the memory 1300 may include one of the stack semiconductor packages according to example embodiments described above. The interface 1400 may function as a data transmission path between the electronic system 1000 and the external device. The controller 1100, the input/output device 1200, the memory 1300, and the interface 1400 may communicate with each other via a bus 1500.

The electronic system 1000 may be used in, for example, a mobile phone, an MPEG-1 Audio Layer-3 (MP3) player, a navigation system, a portable multimedia player (PMP), a solid state disk (SSD), or household appliances.

The foregoing is illustrative of example embodiments and is not to be construed as limiting thereof. Although a few example embodiments have been described, those skilled in the art will readily appreciate that many modifications are possible in example embodiments without materially departing from the novel teachings and advantages of the present invention. Accordingly, all such modifications are intended to be included within the scope of example embodiments as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A stack semiconductor package, comprising:
a first semiconductor package including a first package substrate and a first semiconductor chip mounted on the first package substrate, the first semiconductor chip having first chip pads arranged along a side portion thereof; and
a second semiconductor package disposed on the first semiconductor package and including a second package substrate, a first sub-chip and a second sub-chip mounted on the second semiconductor package, the first sub-chip and the second sub-chip being arranged side by side extending along a direction of a first side portion of the second package substrate, each of the first and second sub-chips having second chip pads arranged along a side portion thereof,
wherein the second package substrate includes second connection pads electrically connected to the second chip pads and arranged along the first side portion of the second package substrate, and
wherein the first package substrate includes first connection pads electrically connected to the first chip pads and arranged along a first side portion of the first package substrate corresponding to the second connection pads.

2. The stack semiconductor package of claim 1, wherein the first sub-chip and the second sub-chip are electrically connected to each other to constitute one memory chip.

3. The stack semiconductor package of claim 2, wherein the first semiconductor chip is a logic chip.

4. The stack semiconductor package of claim 2, wherein the second package substrate comprises at least one connection wire for electrically connecting one or more of the second chip pads of the first sub-chip to one or more of the second chip pads of the second sub-chip.

5. The stack semiconductor package of claim 1, wherein the second chip pads of the first and second sub-chips comprise a data memory pad and a command/address memory pad, and
the first chip pads of the first semiconductor chip comprise a data logic pad and a command/address logic pad.

6. The stack semiconductor package of claim 5, wherein the first connection pads of the first package substrate comprise a first data connection pad electrically connected to the data logic pad and a first command/address connection pad electrically connected to the command/address logic pad, and
the second connection pads of the second package substrate comprise a second data connection pad electrically connected to the data memory pad and a second command/address connection pad electrically connected to the command/address memory pad.

7. The stack semiconductor package of claim 1, wherein the first connection pads are arranged on an upper surface of the first package substrate, and the second connection pads are arranged on a lower surface of the second package substrate facing the upper surface of the first package substrate.

8. The stack semiconductor package of claim 1, further comprising conductive connection members disposed between the first connection pads of the first package substrate and the second connection pads of the second package substrate to electrically connect the first semiconductor chip and the first and second sub-chips.

9. The stack semiconductor package of claim 8, wherein the conductive connection members comprise solder balls.

10. The stack semiconductor package of claim 1, wherein the first semiconductor chip is mounted on the first package substrate by a flip-chip bonding method.

11. The stack semiconductor package of claim 1, wherein the first sub-chip and the second sub-chip are mounted on the second package substrate by a wire bonding method.

12. The stack semiconductor package of claim 1, wherein the first semiconductor chip includes third chip pads arranged along another side portion thereof, and
the second semiconductor package further comprises a third sub-chip and a fourth sub-chip mounted on the second semiconductor package and arranged side by side extending along a direction of a second side portion opposite to the first side portion of the second package substrate, each of the third and fourth sub-chips having fourth chip pads arranged along a side portion thereof.

13. The stack semiconductor package of claim 12, wherein the second package substrate includes fourth connection pads electrically connected to the fourth chip pads and arranged along the second side portion of the second package substrate, and
wherein the first package substrate includes third connection pads electrically connected to the third chip pads and arranged along a second side portion opposite to the first side portion of the first package substrate corresponding to the fourth connection pads.

14. The stack semiconductor package of claim 12, wherein the third sub-chip and the fourth sub-chip are electrically connected to each other to constitute one memory chip.

15. The stack semiconductor package of claim 14, wherein the second package substrate comprises at least one connection wire for electrically connecting one or more of the fourth chip pads of the third sub-chip to one or more of the fourth chip pads of the fourth sub-chip.

16. A stack semiconductor package, comprising:
a first semiconductor package, including:
   a first package substrate; and
   a first semiconductor chip mounted on the first package substrate, the first semiconductor chip having first chip pads arranged along a side portion thereof;
a second semiconductor package disposed on the first semiconductor package, including:
   a second package substrate; and
   a first sub-chip, a second sub-chip, a third sub-chip, and a fourth sub-chip mounted on the second package substrate, the first sub-chip and the second sub-chip being arranged side by side extending along a direction of a first side portion of the second package substrate, the third sub-chip and the fourth sub-chip being arranged side by side extending along a direction of a second side portion of the second package substrate, each of the first, second, third, and fourth sub-chips having second chip pads arranged along a side portion thereof;
wherein the second package substrate includes second connection pads electrically connected to the second chip pads and arranged along the first side portion and the second side portion of the second package substrate, and
wherein the first package substrate includes first connection pads electrically connected to the first chip pads and arranged along a first side portion of the first package substrate corresponding to the second connection pads, and along a second side portion of the first package substrate corresponding to the second connection pads.

17. The stack semiconductor package of claim 16, wherein the first sub-chip and the second sub-chip are electrically connected to each other to constitute one first memory chip, and wherein the third sub-chip and the fourth sub-chip are electrically connected to each other to constitute one second memory chip.

18. The stack semiconductor package of claim 16, wherein the second package substrate comprises at least one first connection wire for electrically connecting one or more of the second chip pads of the first sub-chip to one or more of the second chip pads of the second sub-chip, and wherein the second package substrate comprises at least one second connection wire for electrically connecting one or more of the second chip pads of the third sub-chip to one or more of the second chip pads of the fourth sub-chip.

19. The stack semiconductor package of claim 16, wherein the first connection pads are arranged on an upper surface of the first package substrate, and the second connection pads are arranged on a lower surface of the second package substrate facing the upper surface of the first package substrate.

20. The stack semiconductor package of claim 16, further comprising conductive connection members disposed between the first connection pads of the first package substrate and the second connection pads of the second package substrate to electrically connect the first semiconductor chip and the first, second, third, and fourth sub-chips.

* * * * *